(12) United States Patent
Kiesel et al.

(10) Patent No.: US 9,209,494 B2
(45) Date of Patent: Dec. 8, 2015

(54) MONITORING/MANAGING ELECTROCHEMICAL ENERGY DEVICE USING DETECTED INTERCALATION STAGE CHANGES

(71) Applicant: Palo Alto Research Center Incorporated, Palo Alto, CA (US)

(72) Inventors: Peter Kiesel, Palo Alto, CA (US); Lars Wilko Sommer, Bretten (DE); Ajay Raghavan, Mountain View, CA (US); Bhaskar Saha, Redwood City, CA (US); Tobias Staudt, Nuremberg (DE); Alexander Lochbaum, Landau (DE)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 14/242,853

(22) Filed: Apr. 1, 2014

(65) Prior Publication Data
US 2014/0203783 A1    Jul. 24, 2014

Related U.S. Application Data

(63) Continuation-in-part of application No. 13/630,660, filed on Sep. 28, 2012.

(51) Int. Cl.
*G01B 11/16* (2006.01)
*H01M 10/42* (2006.01)
(Continued)

(52) U.S. Cl.
CPC ........... *H01M 10/4285* (2013.01); *G01K 11/32* (2013.01); *G01L 1/246* (2013.01);
(Continued)

(58) Field of Classification Search
CPC ...... G01B 11/16; G01B 11/18; G01B 11/165; G01L 1/24; G01M 11/086

USPC .................................................. 356/32, 445
See application file for complete search history.

(56) References Cited

U.S. PATENT DOCUMENTS 5,949,219 A    9/1999    Weiss
5,995,686 A    11/1999   Hamburger et al.
(Continued)

FOREIGN PATENT DOCUMENTS

EP          2492989        10/2013
WO    WO2014026093       2/2014

OTHER PUBLICATIONS

Cao-Paz et al, "A Multi-Point Sensor Based on Optical Fiber for the Measurement of Electrolyte Density in Lead-Acid Batteries", Sensors 2010, 10, pp. 2587-2608.
(Continued)

*Primary Examiner* — Abdullahi Nur
(74) *Attorney, Agent, or Firm* — Hollingsworth Davis, LLC

(57) ABSTRACT

A system includes utilizes optical sensors arranged within or on portions of an electrochemical energy device (e.g., a rechargeable Li-ion battery, supercapacitor or fuel cell) to measure operating parameters (e.g., mechanical strain and/or temperature) of the electrochemical energy device during charge/recharge cycling. The measured parameter data is transmitted by way of light signals along optical fibers to a controller, which converts the light signals to electrical data signal using a light source/analyzer. A processor then extracts temperature and strain data features from the data signals, and utilizes a model-based process to detect intercalation stage changes (i.e., characteristic crystalline structure changes caused by certain concentrations of guest species, such as Li-ions, within the electrode material of the electrochemical energy device) indicated by the data features. The detected intercalation stage changes are used to generate highly accurate operating state information (e.g., state-of-charge and state-of-health), and management/control signals for optimizing charge/discharge rates.

20 Claims, 13 Drawing Sheets

(51) Int. Cl.
| | |
|---|---|
| H01M 8/04 | (2006.01) |
| H02J 7/00 | (2006.01) |
| H01G 11/08 | (2013.01) |
| G01M 11/08 | (2006.01) |
| G01K 11/32 | (2006.01) |
| G01L 1/24 | (2006.01) |
| G01R 31/36 | (2006.01) |

(52) U.S. Cl.
CPC ............ *G01M 11/083* (2013.01); *H01G 11/08* (2013.01); *H01M 8/04067* (2013.01); *H01M 10/42* (2013.01); *H02J 7/007* (2013.01); *G01R 31/3606* (2013.01); *G01R 31/3679* (2013.01); *Y02E 10/42* (2013.01); *Y02E 60/13* (2013.01); *Y02E 60/50* (2013.01)

(56) References Cited

U.S. PATENT DOCUMENTS

| | | |
|---|---|---|
| 7,155,075 B2 | 12/2006 | Rajendran et al. |
| 7,310,153 B2 | 12/2007 | Kiesel et al. |
| 7,315,667 B2 | 1/2008 | Schmidt et al. |
| 7,433,552 B2 | 10/2008 | Kiesel et al. |
| 7,511,823 B2 | 3/2009 | Schultz et al. |
| 7,522,786 B2 | 4/2009 | Kiesel et al. |
| 7,589,312 B2 | 9/2009 | Kojima |
| 7,701,590 B2 | 4/2010 | Kiesel et al. |
| 7,718,948 B2 | 5/2010 | Kiesel et al. |
| 7,766,544 B2 | 8/2010 | Shibuya et al. |
| 8,437,582 B2 | 5/2013 | Kiesel et al. |
| 8,594,470 B2 | 11/2013 | Kiesel et al. |
| 2006/0045412 A1 | 3/2006 | Xiao et al. |
| 2009/0027009 A1 | 1/2009 | Sivertsen |
| 2009/0220189 A1 | 9/2009 | Kiesel et al. |
| 2009/0274849 A1 | 11/2009 | Scott et al. |
| 2010/0032009 A1* | 2/2010 | Skryabin ................. 136/256 |
| 2010/0247027 A1 | 9/2010 | Xia et al. |
| 2013/0312947 A1 | 11/2013 | Bandhauer et al. |
| 2013/0314094 A1 | 11/2013 | Farmer et al. |
| 2014/0092375 A1 | 4/2014 | Raghavan et al. |
| 2014/0203783 A1 | 7/2014 | Kiesel et al. |

OTHER PUBLICATIONS

Chehura et al. "Temperature and strain discrimination using a single titled fibre Bragg grating", Opt. Commun., vol. 275. No. 2, Jul. 2007, pp. 344-347.

Corbellini et al. "Modified POF Sensor for Gaseous Hydrogen Fluoride Monitoring in the Presence of Ionizing Radiations", IEEE Transactions on Instrumentation and Measurement, vol. 61, No. 5, May 2012, pp. 1201-1208.

Grobnic et al. "Sapphire Fiber Bragg Grating Sensor Made Using Femtosecond Laser Radiation for Ultrahigh Temperature Applications", IEEE Photonics Technology Letters, vol. 15, No. 11, Nov. 2004, pp. 2505-2507.

Guan et al. "Simultaneous strain and temperature measurement using a single fibre Bragg grating". Electron. Lett., vol. 36, No. 12, 2000, pp. 1018-1019.

Haase: "Strain Sensors Based on Bragg Gratings", IMEKO 20th TC3, 3rd TC16 and 1st TC22 International Conference Cultivating Metrological Knowledge, Nov. 27, 2007, 8 pages, Available online: http://www.micronoptics.com/uploads/library/documents/sensing_documents/StrainsensorsbasedBragggratings.pdf.

Jansen et al. "Low-Cost Flexible Packaging for High-Power Li-Ion HEV Batteries", FreedomCar & Vehicle Technologies Office, Jun. 2004, 56 pages.

Jin et al. "Geometric representation of errors in measurements of strain and temperature", Opt. Eng., vol. 36, No. 8, 1997, pp. 2272-2278.

Jin et al., "Simultaneous measurement of strain and temperature error analysis", Opt. Eng., vol. 36, No. 2, 1997, pp. 598-609.

Juergens et al. "Performance Evaluation of Fiber Bragg Gratings at Elevated Temperatures". NASA, Jan. 2004, 14 pages.

Kersey et al. "Fiber Grating Sensors", Journal of Lightwave Technology, vol. 15, No. 8, Aug. 1997, pp. 1442-1463.

Klein et al. "Optimal Charging Stratgies in Lithium-Ion Battery". American Control Conference (ACC), Jun. 2011, pp. 382-387.

Kumai et al. "Gas Generation Mechanism Due to Electrolyte Decomposition in Commercial Lithium-Ion Cell", Journal of Power Sources, 81-82, 1999, pp. 715-719.

Lee et al, "In Situ Monitoring of Temperature Inside Lithium-Ion Batteries by Flexible Micro Temperature Sensors", Sensors 2011, 11, pp. 9942-9950.

Liang et al. "Highly Sensitive Fiber Bragg Grating Refractive Index Sensors", Applied Physics Letters, vol. 86, 2005, pp. 151122-1-151122-3.

Merzbacher et al. "Fiber Optic Sensors in Concrete Structures: A Review", Smart Mater. Struct., 5, 1996, pp. 196-208.

Micron Optics, "Optical Fiber Sensors Guide". 21 pages [Date Unknown].

Patrick et al. "Hybrid fiber Bragg grating/long period fiber grating sensor for strain/temperature discrimination", IEEE Photonics Technol Lett., vol. 8, No. 9, 1996, pp. 1223-1225.

Qi et al. "In Situ Observation of Strains During Lithiation of a Graphite Electrode", Journal of the Electrochemical Society, vol. 157 (6), 2010, pp. A741-A747.

Qin et al. "Specific Fluorescence Determination of Lithium Ion Based on 2-(2-hydroxyphenyl)benzoxazole", The Royal Society of Chemistry, 2001, pp. 1499-1501.

Rao: "In-Fibre Bragg grating sensors". Meas. Sci. Technol., vol. 8, No. 4, Apr. 1997. pp. 355-375.

Reimers et al. "Electrochemical and In Situ X-Ray Diffraction Studies of Lithium Intercalation in Li x CoO2", Journal of The Electrochemical Society, 139(8). 1992.

Rodrigues et al. "A Review of State-of-Charge Indication of Batteries by Means of A.C. Impedance Measurements". Journal of Power Sources, vol. 87, 2000, pp. 12-20.

Saha et al. "Battery Data Set", NASA Ames Prognostics Data Repository, 2007, Available online: http://li.arc.nas.gov/tech/dash/pcoe/prognostic-data-repository/.

Sang et al. "Temperature-Insensitive Chemical Sensor Based on a Fiber Bragg Grating", Sensors and Actuators B 120. 2007, pp. 754-757.

Sethuraman et al. "Surface structural disordering in graphite upon lithium intercalation/deintercalation", Journal of Power Sources 195 (2010) 3655-3660.

Siegel et al. "Neutron Imaging of Lithium Concentration in FLP Pouch Cell Battery", Journal of the Electrochemical Society, 158(6), 2011, 8 pages.

Smith et al. "Power and Thermal Characterization of a Lithium-Ion Battery Pack for Hybrid-Electric Vehicles", Journal of Power Sources. 160 (1), 2006, pp. 662-673.

Tang et al. "Measurement of Chloride-Ion Concentration with Long-Period Grating Technology", Smart Mater. Struct., vol. 16, 2007, pp. 665-672.

Triollet et al. "Discriminated measures of strain and temperature in metallic specimen with embedded superimposed long and short fibre Bragg gratings", Meas. Sci. Technol., vol. 22, No. 1, Jan. 2011, pp. 015202.

Udd et al. "Fiber Optic Distributed Sensing Systems for Harsh Aerospace Environments", Proc. SPIE 3674, Smart Structures and Materials 1999. Industrial and Commercial Applications of Smart Structures Technologies, 136 (Jul. 9, 1999) 12 pages.

Van Steenkiste et al. "Strain and Temperature Measurement with Fiber Optic Sensors", 1997, 9 pages.

Wang et al. "Simultaneous measurement of strain and temperature using dual-period fiber grating", Proc. SPIE, vol. 4579, 2001, pp. 265-268.

Wang et al. "Understanding Volume Change in Lithium-Ion Cells during Charging and Discharging Using In Situ Measurements". Journal of The Electrochemical Society, 154(1), 2007.

Xu et al. "Discrimination between strain and temperature effects using dual-wavelength fibre grating sensors", Electron. Lett., vol. 30, No. 13, pp. 1085-1087, 1994.

(56) References Cited

OTHER PUBLICATIONS

Zhao et al. "Discrimination methods and demodulation techniques for fiber Bragg grating sensors", Opt. Lasers Eng. vol. 41, No. 1, pp. 1-16, Jan. 2004.

Zhou et al. "Simultaneous measurement for strain and temperatures using fiber Bragg gratings and multimode fibers". Appl. Opt., vol. 47, No. 10, Apr. 2008, pp. 1668-1672.

U.S. Appl. No. 14/257,673, filed Apr. 21, 2014, Raghavan et al

U.S. Appl. No. 14/331,318, filed Jul. 15, 2014, Hegyi et al.

Koch et al., "Arrayed waveguide grating interrogator for fiber Bragg grating sensors: measurement and simulation", Applied Optics, vol. 51, No. 31, Nov. 1, 2012, pp. 7718-7723.

Niewczas et al. "Performance Analysis of the Fiber Bragg Grating Interrogation System Based on an Arrayed Waveguide Grating", IEEE Transactions of Instrumentation and Measurement, vol. 53, No. 4, Aug. 2004, pp. 1192-1195.

Li et al., "Preliminary Investigation of an SOI-based Arrayed Waveguide Grating Demodulation Integration Microsystem" Scientific Reports, May 6, 2014, 6 pages.

Pinson et al., Theory of SEI Formation in Rechargeable Batteries. Capacity Fade, Accelerated Aging and Lifetime Prediction, $223^{rd}$ ECS Meeting, May 12-17, 2013, 29 pages.

Roth et al., "Thermal Abuse Performance of 18650 Li-Ion Cells", Sandia Report, Mar. 2004, pp. 1-139.

Wang et al., "Aging Effects to Solid Electrolyte Interface (SEI) Membrane Formation and the Performance Analysis of Lithium Ion Batteries", Int. J. Electrochem, Sci., 6, 2011, pp. 1014-1026.

File Histroy for U.S. Appl. No. 13/630,660 as retrieved from the U S Patent and Trademark Office on Apr. 30, 2015, 127 pages.

* cited by examiner

MONITORING/MANAGING ELECTROCHEMICAL ENERGY DEVICE USING DETECTED INTERCALATION STAGE CHANGES

RELATED APPLICATIONS

This application is a continuation in part of U.S. patent application Ser. No. 13/630,660, entitled "Monitoring And Management For Energy Storage Devices" filed Sep. 28, 2012.

STATEMENT REGARDING FEDERALLY SPONSORED RESEARCH AND DEVELOPMENT

This invention was made with government support under contract number ARPA DE-AR0000274, awarded by ARPA-E (Advanced Research Projects Agency—Energy). The U.S. Government has certain rights in this invention.

TECHNICAL FIELD

This application relates generally to techniques for monitoring and/or managing energy storage and/or power systems. The application also relates to components, devices, systems, and methods pertaining to such techniques.

BACKGROUND

With the rapidly evolving technology of the smart grid, hybrid (including plug-in hybrid) and plug-in electric vehicles (xEVs), rechargeable batteries have emerged as the most prominent electrochemical energy source. Electrochemical energy is the field of energy technology concerned with electrochemical methods of energy conversion and energy storage. Electrochemical energy conversion devices (e.g., fuel cells) generate electricity by converting the chemical energy from a fuel (e.g., hydrogen) through a chemical reaction with an oxidizing agent. Although many experts believe electrochemical conversion devices, such as fuel cells, will eventually replace rechargeable batteries as the most-used electrochemical energy device, electrochemical conversion devices are currently not economically feasible, and may not be for decades. Unlike electrochemical energy conversion devices, electrochemical energy storage devices (e.g., rechargeable batteries and supercapacitors) do not require a fuel supply, but must be periodically recharged in order to supply electricity. Although supercapacitors (aka, ultracapacitors) require much less time to charge than rechargeable batteries, rechargeable batteries store and supply far more energy, and are thus the most prominent electrochemical energy device in use today.

Smart grid and EV systems typically include management systems that utilize various sensors to monitor and control the operational state of an electrochemical energy system. For example, a conventional battery management system (BMS) is often utilized to process sensor information received from current, voltage and temperature sensors connected to multiple rechargeable batteries at different battery cell, battery module, and battery pack levels. The sensor data is processed to determine the condition of the battery system expressed by terms like (but not limited to) state-of-charge (SOC), -power (SOP), -health (SOH), capacity, impedance, structural integrity (electrode cracking and delamination), cell packaging and sealing, terminal voltage, temperature, pressure and strain. By processing the sensor data and initiating appropriate actions, the BMS not only controls the operational conditions of the battery to prolong its life and guarantee its safety (e.g., by disconnecting a battery cell to prevent the uncontrolled release of concentrated energy), but also provides accurate estimation of the SOC and SOH for energy management modules in the smart grid and xEVs.

Although conventional BMS approaches provided acceptable SOX information for conventional uses in portable electronics, there is a growing need for a more accurate and reliable BMS approach for today's smart grid and xEV systems. For example, accurate SOX information is very important in EV systems so that the BMS can control and utilize a pack within its true safe limits of operation to avoid degradation or failure. These operational limits depend on environmental conditions, age, and usage. It can also enable an xEV driver to know how much longer a vehicle will operate in electric mode before recharging and/or servicing. Current methods for determining SOC information in xEV systems rely on voltage and current measurements; voltage measurements can be "flat" (i.e., relatively unchanging) at certain intermediate charge levels. In addition, the correlation between voltage and SOC can change as cells age. These factors can lead to inaccurate SOC estimates. Similarly, conventional BMS systems typically determine a battery's SOH by way of estimating capacity drops, detecting unusual temperature, current and voltage changes. Although this approach may provide useful information near the end of a battery's lifetime (i.e., by detecting battery failure), it typically is not useful at predicting failure in advance, preventing degradation, or for tracking cell aging. Moreover, because rechargeable batteries are used in increasingly challenging environments, are required to provide greater power and energy densities, and are expected to have longer useful lifetimes, it is becoming even more difficult to generate reliable and accurate SOX information using conventional BMS methodologies.

Therefore, there is a clear need for an improved electrochemical energy device management system that employs improved methodologies capable of providing accurate SOC information during the entire charge cycle of the device, and capable of providing accurate SOP and SOH information throughout the device's operating lifetime. One way to provide improved SOX information is by way of monitoring internal battery phenomena such as the transport of charged and neutral species, current conduction, fluid flow, heat transfer, chemical reactions (including parasitic reactions) at the electrode surfaces, gas formation, material balance and phase transition, and the intercalation of ionic species into porous electrodes with associated momentum transfer. For example, in electrochemical energy devices that utilize intercalation compounds (guest species) to store energy, such as a Li-ion rechargeable batteries or some supercapacitors, the electrode material typically undergoes crystalline structure "stage" changes during charging and discharging events (operations). These crystalline structure "stage" changes occur because the electrode material expands or contracts, respectively, as it accepts ions during charging, or loses (withdraws) ions during discharging. Intercalation stage transition points are repeatable, detectable events that occur within the electrode material with respect to charge/discharge states, and can be used to determine current (i.e., point-in-time) ion concentration levels within the electrode material. For example, certain graphite electrodes undergo five distinct crystalline structural changes over a charge cycle, as illustrated in FIG. 17, ranging from Stage 1 (fully charged) to Stage 5 (fully discharged).

Although the intercalation stage change phenomena can provide highly useful information for purposes of monitoring the SOX of an electrochemical energy storage device, the intercalation stage transition points cannot be measured directly by conventional methods like voltage, current and temperature measurements during runtime (i.e., during normal operating conditions), and existing methodologies require expensive equipment suitable only for laboratory settings. For example, currently identification of intercalation stages is performed primarily by slow scan rate cyclic voltammetry (SSCV), and potentiostatic intermittent titration (PITT) and electrochemical impedance spectroscopy (EIS) are also conducted in order to study the potentiodynamic behavior of batteries that are correlated to the intercalation stages. EIS provides a conventional approach for battery SOH estimation using intercalation stage information, but requires extensive prior calibration in the "healthy" condition, and also requires the battery to be in electrochemical equilibrium, and therefore is unsuitable for runtime monitoring. X-ray diffractometry and Fourier transform infrared (FTIR) spectroscopy are used in order to follow structural and surface chemical changes of battery electrodes under cycling, and Raman spectroscopy and atomic force microscopy (AFM) are also used for the structural characterization of materials used as electrodes in rechargeable lithium batteries. Other approaches for laboratory-level characterizations of internal cell state for model validation have included neutron radiography and optical microscopy in specially designed cells with quartz viewing windows. However, none of these methodologies are feasible outside a laboratory setting for use in full-time commercial applications, for example, such as monitoring the SOC and SOH of rechargeable batteries utilized to power xEVs.

What is needed is a low-cost, reliable system and method for detecting intercalation stage transition points of an electrode material within an electrochemical energy storage device. In particular, what is needed is a practical management system and management method for accurately determining the SOX (e.g., SOC and SOH) of electrochemical energy storage devices, such as rechargeable batteries utilized to power EVs, by way of measuring and recording such intercalation stage transition points.

SUMMARY

The present invention is directed to systems and methods for monitoring and/or managing energy storage devices, power systems and other such electrochemical energy devices that utilize electrode materials and guest species to generate electrical energy for an applied load. In some embodiments, a monitoring and management system (MMS) includes one or more optical fibers arranged within or on portions of an electrochemical energy device, where each optical fiber includes one or more optical sensors. Each of the optical sensors is configured to sense (measure) an operating parameter of the electrochemical energy device (e.g., strain and/or temperature). The MMS includes an analyzer having a light source configured to provide light to the one or more optical fibers, and one or more detectors configured to detect light received from the optical sensors. The detectors generate electrical signals including operating parameter data (e.g., strain data and/or temperature data) contained in the optical sensor output light. A processor is coupled to receive the electrical signals, to analyze the measured parameter data to detect characteristic features associated with intercalation stage changes, and to determine the most recent "real-time" intercalation state and state-of-charge (SOC) of the electrochemical energy device based on analysis or on a stored history of the detected intercalation stage changes and other strain/temperature signal features. By utilizing optic sensors, optical fibers and sensitive electronic circuitry to measure strain and temperature changes, the present invention provides a low-cost methodology for detecting intercalation stage changes that can be utilized, for example, in xEV vehicles to determine SOC information that is substantially more accurate than is possible using conventional methods. In addition, by analyzing the timing and duration and of the intercalation stages, the present invention facilitates generating state-of-health (SOH) information that is substantially more accurate than conventional methods. By estimating the load current needed to discharge the battery to a known intercalation stage transition point, state-of-power (SOP) can also be estimated.

DESCRIPTION

Battery management systems that rely on external cell performance parameters to determine state-of-charge (SOC) and/or state-of-health (SOH) result in conservative overdesign to manage the uncertainty in battery state-of-charge and battery degradation with aging. This reliance on conservative overdesign of batteries has affected the widespread adoption of clean technologies such as electric vehicles and power grid storage. Conservative overdesign of batteries arises in part because the battery state cannot be fully understood from external parameters alone. This situation also applies to other types of energy storage devices and/or power generation systems where it is difficult to measure internal parameters.

The present invention is described below with specific reference to optically-based smart monitoring and management systems that determine SOC and SOH information in electrochemical energy storage devices utilizing guest species, such as Lithium-ion (Li-ion) rechargeable batteries. The monitoring and management systems disclosed herein enable comprehensive real-time performance management and reduce overdesign of power and/or energy systems utilizing such electrochemical energy storage devices. The monitoring and management systems disclosed herein utilize either external fiber optic sensors to detect external energy storage/power system parameters taken from an outer surface of a cell wall encasing the electrode material and guest species, internal sensors to detect internal energy storage/power system parameters from inside the cell wall, or a combination of external and internal sensors that provide both external and internal parameters. The outputs from the sensors are used by smart algorithms to determine state-of-charge (SOC) information by determining a most recent intercalation stage, and to make predictions such as state-of-health (SOH) and remaining useable energy of the energy storage system by detecting variations in intercalation stage onset and duration. Although the approaches disclosed herein are described with particular reference to electrochemical energy storage devices (e.g., rechargeable batteries and battery packs and supercapacitors), the approaches are also applicable to other electrochemical energy devices, such as fuel cell stacks, turbine-based power systems, and other types of energy storage and power generation devices and systems that utilize intercalation materials in the manner described herein.

Figure 1A:
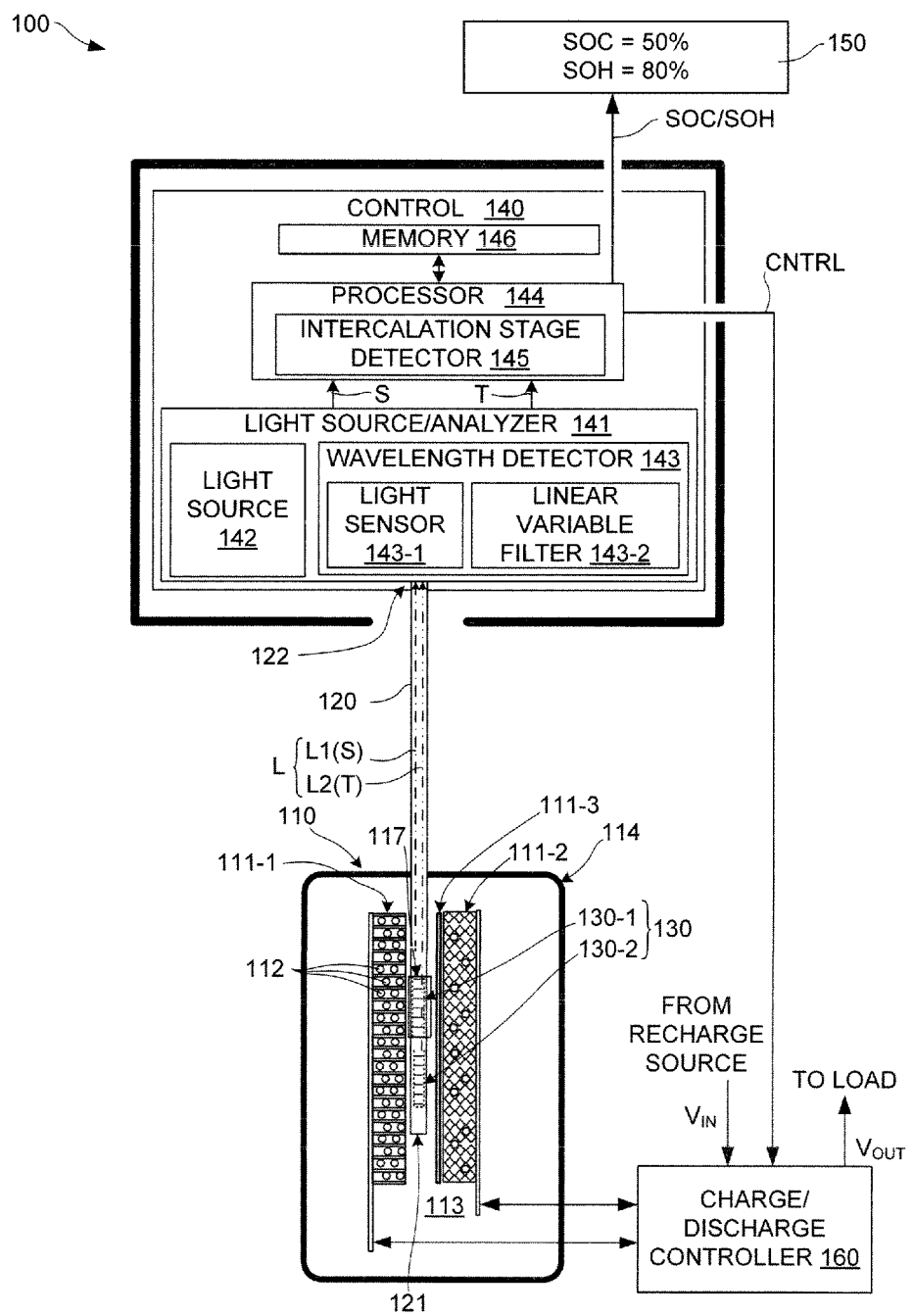
FIGS. 1(A), 1(B) and 1(C) are simplified block diagrams depicting monitoring and management systems according to generalized embodiments of the present invention.

Referring to the upper portion of FIG. 1(A), in the disclosed embodiment SOC and SOH information generated by processor 144 is provided to an operator via an electronic display 150. In alternative embodiments, the SOC and SOH information is generated using external strain/temperature parameters, internal strain/temperature parameters, or a combination of external and internal strain parameters. For example, processor 144 may compile, analyze, trend, and/or summarize the internal and/or external parameters, and/or may perform other processes based on the internal and/or external parameters, such as predicting and/or estimating the state of the energy storage/power system. The results of these processes and/or other information derived from monitoring the energy storage/power system may be provided in a report that can be displayed graphically or textually or in any convenient form to an energy storage/power system operator and/or may be provided to another computer system for storage in a database and/or further analysis. In alternative embodiments, processor 144 is implemented using a microprocessor configured to execute programming instructions consistent with the processes described herein, or one of a programmable logic device (e.g., a field programmable gate array) or an application specific integrated circuit that is configured using known techniques to implement the processes described herein. In this context, a "processor" should be understood in very general terms which may even include a smart display that allows extraction and visualization of the intercalation stages from the measured data.

FIG. 1(A) shows a simplified system 100 according to an exemplary embodiment of the present invention. System 100 generally includes an electrochemical energy device (EED) 110, at least one optical fiber 120, optical sensors 130-1 and 130-2, a control circuit 140, and an optional display 150.

According to an aspect of the present invention, EED 110 is of a type including anode electrode material layers 111-1, cathode electrode material layers 111-2, separator layers 111-3, an guest species 112, and an electrolyte 113 that are contained within an outer shell (cell wall) 114. For brevity, only one electrode "pair" (i.e., one anode layer 111-1 and one cathode layer 111-2) is shown in FIG. 1(A). EED 110 is characterized in that guest species 112 migrates between anode electrode material layers 111-1 and cathode electrode material layers 111-2 through an intervening membrane by way of an electrolyte 113, thereby causing crystalline structure "intercalation stage" changes in the electrode material "stack" formed by anode layers 111-1 and cathode layers 111-2 during charging and discharging events (operations). These crystalline structure "stage" changes occur because the electrode material stack expands or contracts, respectively, as it accepts guest species (ions) 112 (e.g., by anode layers 111-1 during charging), or loses (withdraws) guest species (ions) 112 (e.g., by anode layers 111-1 during discharging).

In a specific embodiment of the present invention, EED 110 is a Lithium-ion (Li-ion) rechargeable battery in which electrode material layers 111-1 and 111-2 are formed in stacks and comprise graphite and guest species 112 comprises Lithium-ions, and electrolyte 113 comprises $LiPF_6$ salt in an organic solvent. Li-ion batteries have gained a lot of interest in the past years, and are currently the most-used electrochemical energy storage device at this time because they offer big advantages compared to Ni—Cd, NI-MH and other common battery chemistries, such as particular high discharge rates and an exceptional high capacity. As a Li-ion battery is being cycled, a voltage applied between the anode and cathode leads to a movement of Li-ions 112. This voltage is usually applied in a way that the Li-ions are intercalated into the anode material stack 111-1 first. Intercalation is the reversible inclusion of a Li-ion in the crystallographic structure of each electrode material stack. Because the electrode material has a certain crystallographic structure, conditioned by the pursuit of energy minimization, the intercalation of Li-ions changes (usually increases) the interlayer spacing of the electrode material stack. The increase of the interlayer spacing leads to a small but measurable increase in the thickness of the electrode stack formed by anode electrode layers 111-1 and cathode electrode layers 111-2. Since a Li-ion battery usually consists of several stacked layers of cathode and anode material, the entire battery increases its thickness significantly during cycling. This phenomenon is known as electrode breathing. In the particular example of a Li-ion pouch cell, the growth of the electrode stack is translated in a lateral expansion of cell case (wall) 114. As set forth below, by detecting incremental changes in cell wall thickness and correlating those changes to stored data, the present invention facilitates the detection of intercalation change events.

Optical fiber 120 is an elongated thin transparent fiber made of high quality extruded glass (silica) or plastic that functions as a waveguide (or "light pipe") to provide light between first (e.g., end) portion 121 and second portion 122. First portion 121 of optical fiber 120 is operably connected to EED 110 by way of a suitable connecting structure, and second portion 122 of optical fiber 120 is connected to control circuit 140. As such, optical fiber 120 is arranged to transmit operating parameter data from EED 110 to control circuit 140 in the form of light signals.

Optical sensors 130-1 and 130-2 are disposed on (i.e., formed on "functionalized" portions of or formed within the core (i.e., inscription of Bragg grating) of) optical fiber 120 using known techniques such that light transmitted along optical fiber 120 is affected by and reflected from optical sensors 130-1 and 130-2, respectively. In a presently preferred embodiment, optical sensors 130-1 and 130-2 are wavelength-encoded fiber sensors (such as Fiber Bragg Grating (FBG) sensors) in which the reflection spectrum (light wavelength) changes in response to an applied stimulus (e.g., temperature or strain) in the manner described in additional detail below with reference to FIGS. 3-6. Other types of optical sensors may be utilized, such as etalon or Fabry-Perot (FP) sensors, which together with FBG sensors are collectively referred to herein as fiber optic (FO) sensors. Optical sensors 130-1 and 130-2 are operably disposed on EED in a configuration that facilitates detecting (sensing) a strain parameter and a temperature parameter of EED 110. In the disclosed embodiment, optical sensor 130-1 is an FBG sensor formed by known techniques and located near portion 121 of optical fiber 120 that is connected (e.g., by using a bonding agent) to an external surface of cell wall (case) 114 by way of connector 117 such that optical sensor 130-1 is affected by mechanical strain of cell wall 114, whereby optical sensor 130-1 is configured to sense a strain parameter of EED 110 (e.g., the expansion or contraction of cell wall 114). In contrast, optical sensor 130-2 is an FBG sensor disposed on optical fiber 120 such that optical sensor 130-1 is affected by temperature variations of EED 110 (but not by strain), whereby optical sensor 130-2 is configured to sense an external temperature parameter of EED 110. As explained below, this arrangement facilitates the accurate measurement of changes in the thickness of the electrode stack, thereby facilitating the detection of intercalation stage changes.

Figure 1B:
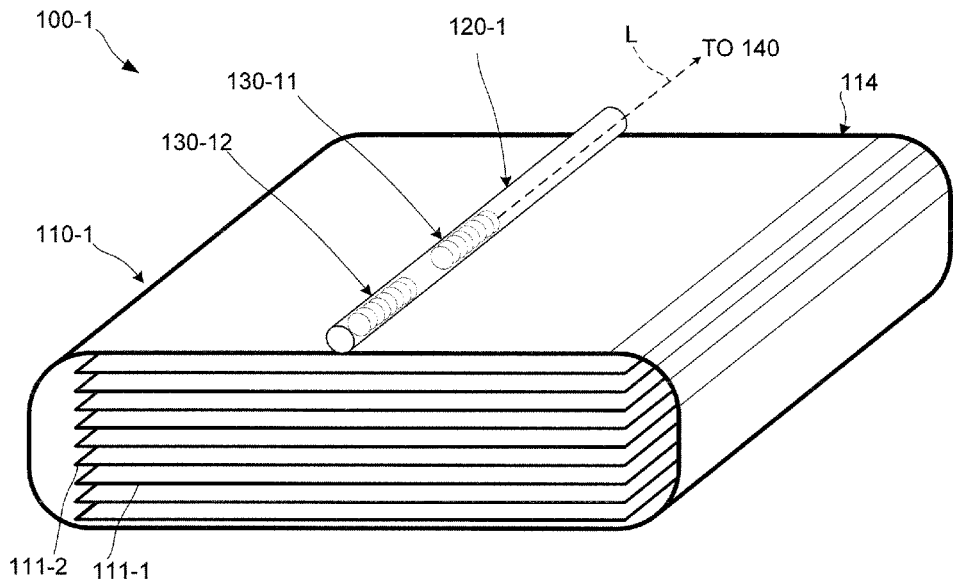
Figure 1C:
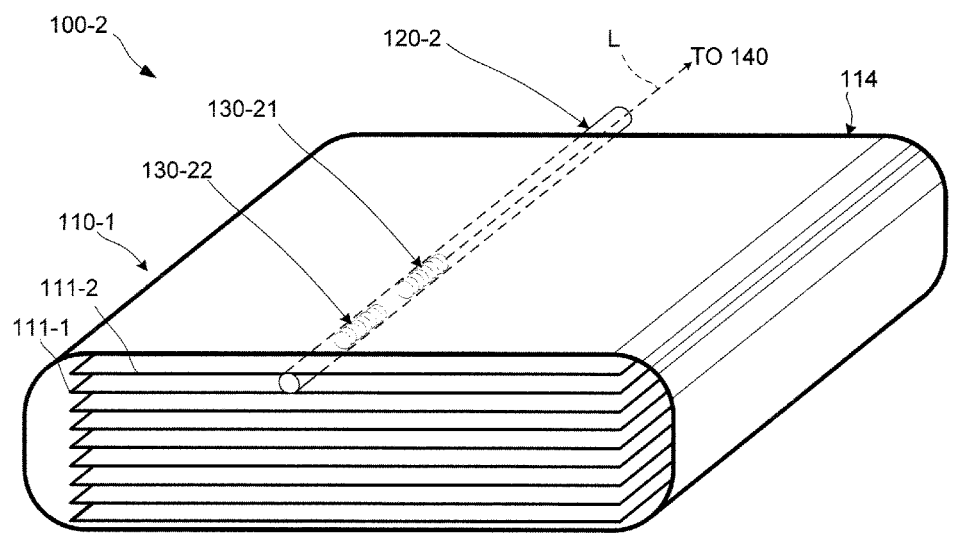

FIGS. 1(B) and 1(C) show alternative arrangements in which are arranged to measure either external operating parameters (e.g., from an external surface of cell wall 114), or internal operating parameters (i.e., from an internal location of EED 110 inside cell wall 114). FIG. 1(B) shows a first system 100-1 in which optical sensors 130-11 and 130-12 are disposed on optical fiber 120-1 that is operably attached to an external surface of cell wall 114 of EED 110-1, whereby optical sensor 130-11 is operably attached and configured to measure mechanical strain of cell wall 114, and optical sensor 130-12 is operably attached and configured to measure an external temperature of cell wall 114. FIG. 1(C) shows an alternative system 100-2 in which optical sensors 130-21 and 130-22 are disposed on optical fiber 120-2 that extends through cell wall 114 of EED 100-2, with optical sensor 130-21 operably bonded to either an inside surface of cell wall 114 or to one of electrode layers 111-1 and 111-2 and configured to measure an internal mechanical strain of EED 100-2, and optical sensor 130-22 being operably attached and configured to measure an internal temperature of EED 100-2. In yet another embodiment (not shown), external sensors may be utilized in conjunction with one or more internal sensors to measure both internal and external operating parameters. In addition, one or more additional sensors may be utilized to measure other operating parameters of an EED. For example, internal optical sensors may be used measure one or more parameters such as vibration, ion concentration, or chemistry.

Referring to the upper center of FIG. 1(A), control circuit 140 includes light source/analyzer circuit 141, a processor 144 and memory 146 that function (i.e., are configured by appropriate hardware and software) to identify intercalation stage changes of EED 110 by analyzing at least one of strain data S and temperature data T generated by optical sensors 130-1 and 130-2 using the methodologies set forth below with reference to FIGS. 9-16.

Light source/analyzer circuit 141 is connected to (second) portion 122 of optical fiber 120, and includes both a light source 142 and a wavelength detector (light sensing circuitry) 143 that operate in the manner described below with reference to FIGS. 7 and 8 to obtain strain and temperature parameter data. Briefly, light source 142 is controlled to transmit light having one or more wavelengths through optical fiber 120 to optical sensors 130-1 and 130-2, and wavelength detector 143 includes a light sensor 143-1 capable of receiving light signals L1(S) and L2(T) generated by optical sensors 130-1 and 130-2, and electronic circuitry for converting these light signals into an electric strain data signal S and an electric temperature data signal T, respectively. The light transmitted from light source 142 travels along optical fiber 120 and interacts with optical sensors 130-1 and 130-2 in a way that causes optical sensors 130-1 and 130-2 to generate reflected light signals L1(S) and L2(T), respectively, that are respectively affected (modulated) by strain and/or temperature parameters sensed (measured) at cell wall 114 such that wavelengths of the reflected light are shifted by amounts proportional to distortions of optical sensors 130-1 and 130-2. In one embodiment, optical sensor 130-1 is mounted to cell wall 114 such that it is distorted in accordance with strain parameter changes (i.e., corresponding expansion/contraction of cell wall 114), whereby the wavelength of light signal L1(S) reflected from optical sensor 130-1 is modulated by these distortions to include corresponding strain parameter information (S). Similarly, optical sensor 130-2 is mounted to cell wall 114 such that it is distorted in accordance with temperature parameter changes (i.e., the temperature at cell wall 114), whereby the wavelength of light signal L2(T) reflected from optical sensor 130-2 is modulated by the sensor distortions to include corresponding temperature parameter information (T). The reflected light signals L1(S) and L2(T) travel back along optical fiber 120 to wavelength detector 141 for conversion into strain signal S and temperature signal T by wavelength detector 143, which then passes strain data signal S and temperature data signal T to processor 144. According to an aspect of the present embodiment, wavelength detector (light sensing circuitry) 143 utilizes a linear variable filter 143-2 to resolve sub-picometer wavelength shifts in light signals L1(S) and L2(T) in the manner described below with reference to FIGS. 7 and 8, and further disclosed in U.S. Pat. No. 8,594,470, entitled "Transmitting light with lateral variation", and in U.S. Pat. No. 8,437,582 entitled "Transmitting Light With Photon Energy Information", both incorporated herein by reference in their entirety. Detecting sub-picometer wavelength shifts in FO sensor signals by way of a compact, robust, and low-cost interrogation unit, such as linear variable filter 143, facilitates the detection of subtle features that may either not be detectable in coarser electrical signals, or are otherwise buried in electro-magnetic interference (EMI), whereby intercalation stage change detection is enhanced. In alternative embodiments, the slight wavelength shift caused by temperature and strain is determined using other known techniques.

According to an aspect of the present invention, processor 144 is configured to function, in part, as an intercalation stage change detector 145 that detects (identifies) intercalation stage changes of EED 110 by analyzing parameter data associated with at least one operating parameter (e.g., strain data signals S and temperature data signals T). As mentioned above and described in additional detail below, the intercalation stage changes are caused by migration of the guest species 112 between electrode material layers 111-1 and 111-2. In specific embodiments described below, intercalation stage change detector 145 detects intercalation stage change events within Li-ion batteries by analyzing present (most recently measured) strain data S and/or temperature data T using a model-based process that generates estimated parameter values from previously received strain/temperature data, which may be stored in a memory 146, and compares the estimated values with the actual values to detect characteristic strain/temperature changes associated with the various intercalation stage change events that occur during charge and discharge cycles of EED 110. Processor 140 then processes the detected intercalation stage change information to determine operating state (e.g., SOC and/or SOH) information, which is then transmitted to a display 150 for visual presentation to user (e.g., the driver of an xEV). Alternatively (or in addition), processor 140 generates control information signals CNTRL in accordance with the detected intercalation stage changes that is utilized to control at least one of a charging rate and a discharging rate of EED 110 during charge/discharge cycling (i.e., normal operating periods) by way of a charge/discharge controller 160.

Figure 2:
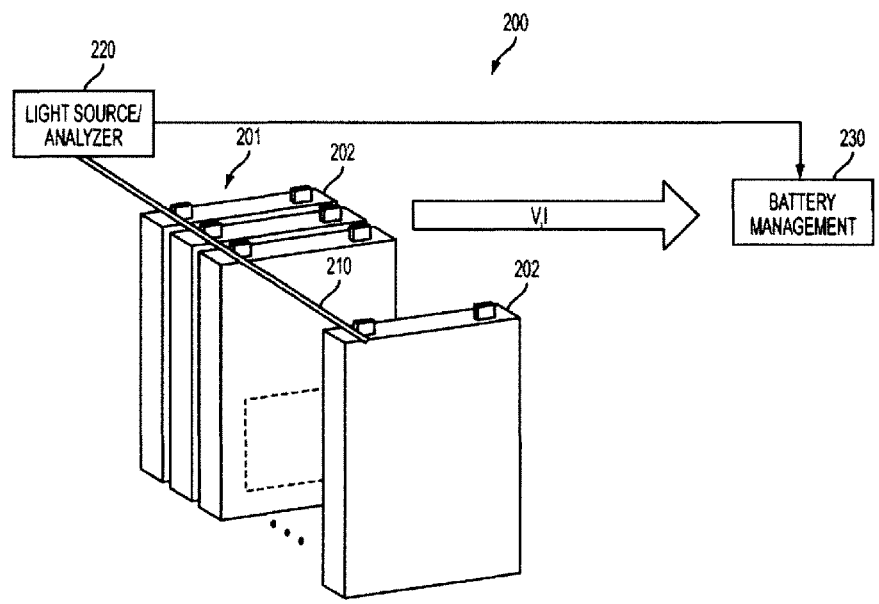
FIG. 2 depicts a block diagram of a monitoring and management system for a battery.

FIG. 2 illustrates a battery 201 that is monitored and/or managed by a battery monitoring and management system (BMMS) 200 according to an alternative embodiment of the present invention. The monitoring portion of the BMMS comprises a number of multiplexed FBG sensors (not shown) embedded within or disposed on cells 202 of battery 201 and disposed on a single optical fiber (FO) cable 210. BMMS system 200 may include one or more FO cables, where each FO cable includes multiple optical sensors that are arranged in a manner similar to that described above with reference to FIG. 1(A). In various implementations, the strain and temperature parameters of battery 201 as a whole, e.g., average parameters across multiple cells, and/or strain/temperature parameters of one or more of the battery cells can be monitored. In addition to strain and temperature, a non-limiting illustrative set of additional parameters that may be monitored by the sensors includes one or more of stress, internal pressure, ion concentration, and/or chemical composition or concentration.

The BMMS 200 includes a light source/analyzer 220 coupled to the FO cable 210. Although one light source/analyzer 220 is shown in FIG. 2, in some configurations multiple light source/analyzers may be respectively coupled to multiple FO cables that include multiplexed optical sensors.

Light from the light source/analyzer 220 is transmitted through the FO cable 210 where the transmitted light interacts with the FBG sensors that are spaced apart along the FO cable 210. Reflected light signals including temperature and strain data are detected and analyzed by the detector/analyzer portion of the light source/analyzer 220. In some implementations, the voltage and/or current of the battery 201 and/or other external battery parameters may also be measured and provided to the battery management processor 230.

The FBG sensors utilized in system 200 are similar to those described above with reference to FIG. 1(A), and are formed by a periodic modulation of the refractive index along a finite length (typically a few mm) of the core of the FO cable. This pattern reflects a wavelength, called the Bragg wavelength that is determined by the periodicity of the refractive index profile of the FBG sensor. In practice, the sensor typically reflects a narrow band of wavelengths centered at the Bragg wavelength. The Bragg wavelength at a characteristic or base value of the external stimulus is denoted $\lambda$ and light having wavelength $\lambda$ (and a narrow band of wavelengths near $\lambda$) are reflected when the sensor in the base condition. For example, the base condition may correspond to 25° C. and/or zero strain. When the sensor is subjected to an external stimulus, such as temperature, strain, or other such stimulus, the stimulus changes the periodicity of the grating and the index of refraction of the FBG, and thereby alters the reflected wavelength to a wavelength, $\lambda_s$, different from the base wavelength, $\lambda$. The resulting wavelength shift, $\Delta\lambda/\lambda$, $-\lambda_s)\lambda$ is a direct measure of the stimulus.

The relation between wavelength shift ($\Delta\lambda/\lambda$) and simultaneous strain and temperature in an FBG sensor is:

$$\Delta\lambda/\lambda = \{1 - n^2/2[p_{12} - n(p_{11} + p_{12})]\}\in_1 + [\alpha + 1/n(dn/dT)]\Delta T \quad [1]$$

where n is the index of refraction, $p_{11}$ and $p_{12}$ are strain-optic constants, $\in_1$ is longitudinal strain, a is the coefficient of thermal expansion and T is the temperature. In some implementations, by using multiple FBG sensors that are differently affected by strain and temperature (due to design or mounting), dual fibers or special FBG sensors in combination with data evaluation algorithms, the impacts from strain and temperature on the wavelength shift can be separated.

Examining the response of FBG sensors quantified in Equation [1], it is clear that these sensors are sensitive to changes in refractive index n, strain $\in_1$, and ambient temperature changes $\Delta T$. The refractive index n can be made sensitive to the chemical environment of the sensor by stripping the FO cladding over the sensor element region and/or by adding appropriate coatings to this sensitive area. Alternately, FBG sensors can be made sensitive to the chemical environment by applying special coatings that convert the chemical composition of the environment into a strain signal (e.g. hydrogen sensors based on palladium coatings). According to embodiments discussed herein, optical sensors such as FBG sensors are used to detect chemical composition changes in battery cells that might affect performance. An example of this is formation of a corrosive agent, hydrogen fluoride (HF), in Li-ion cells caused by moisture penetration.

The sensitivity of FBGs to temperature changes allows local temperatures within battery cells to be monitored. While this is useful in general for battery system management, it is particularly beneficial for early detection of thermal runaways. Thermal runaways affect many battery chemistries and can be devastating in Li-ion cells due to their high energy density. During a thermal runaway, the high heat of the failing cell can propagate to the next cell, causing it to become thermally unstable as well. In some cases, a chain reaction occurs in which each cell disintegrates at its own timetable. A pack of battery cells can be destroyed within a few seconds or can linger on for several hours as each cell is consumed one-by-one.

The sensitivity of the FBG sensors to strain allows embedding FBG sensors into battery electrodes to monitor the expansion/contraction cycles of the electrodes (which is useful for estimating charge levels, e.g. in Lithium-ion cells). Additionally, electrode strain measurements allow for examining the degradation of the electrodes, and thus the overall degradation of the battery. FBG sensitivity to strain also allows measurement of internal cell pressure by capturing cell wall strains.

In measuring power supply parameters using FBG sensors, it can be beneficial to distinguish between and quantify the individual contributions of the multiple parameters of interest. In some cases, a multi-sensor configuration may be used so that the parameter of interest can be compensated for the contributions of other parameters. For example, a two-sensor approach may be used for temperature-compensated chemical sensing, where the two sensors can be arranged in close proximity. In some implementations, a first sensor of the two sensors is exposed to temperature and is also exposed to the chemical environment by stripping its cladding. A second sensor of the two sensors used for compensation retains its cladding and is only sensitive to temperature. Similar configurations may be used for temperature-compensated strain measurements and strain-compensated temperature measurements.

For temperature-compensated strain measurements, two FBG sensors are placed in close proximity (e.g., as indicated by optical sensors 130-1 and 130-2 in FIG. 1(A)), where the first sensor is exposed to strain and temperature and a second sensor used for compensation is exposed to temperature but not strain. In one embodiment, the temperature measurement of the second sensor is used to compensate for changes in temperature in the strain measurement of the first sensor. For example, the first sensor may be placed within an electrode or cell wall of a battery and the second sensor may be placed nearby and/or at a location having about equal temperature as the location of the first sensor while being subjected to a known and/or non-varying strain. For example, the second sensor may be located near but not within the electrode or cell wall. As described below, in another embodiment the temperature measurement of the second sensor may also be utilized to identify intercalation stage changes independently, or correlated with strain measurements to identify intercalation stage changes.

Fiber optic sensors have been demonstrated to withstand and perform in various harsh environments. The most common material used is silica, which is corrosion resistant, can withstand high tensile strain, and can survive between −200° C. and 800° C. Silica-based FBG sensors provide repeatable dependency of their peak wavelength with temperature consistently with no thermal hysteresis in tests done up to 300° C. It is expected that FBG sensors will survive long-term (13-25 years) in lead acid batteries and at least up to a year in HF (a side product of Li-ion batteries: one year is expected to be longer than the life of the Li-ion battery after HF formation begins). Various types of plastics are also useful for FO cables and optical sensors. Fiber optic sensors such as FBG sensors and etalon (FP) sensors are robust with respect to shock and vibration. Thus, embedded fiber optic sensors in energy storage/power systems such as batteries offer an attractive solution to reliably measure and monitor relevant parameters across various architectures and chemistries.

Figure 3:
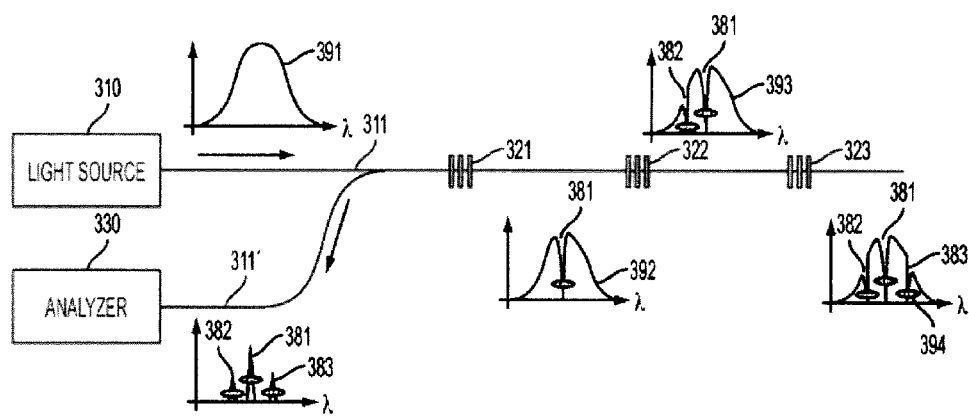
FIG. 3 illustrates reflected spectra for fiber Bragg grating (FBG) sensors used in a power supply sensing and management system.

FBG-based sensing allows for incorporating multiple sensing elements, e.g., about 64 sensors, on a single FO cable. Each of the sensors can be individually interrogated through multiplexing, e.g., wavelength division multiplexing (WDM) or optical time division multiplexing (TDM). One special implementation of wavelength division multiplexing for multiple sensors is illustrated in FIG. 3. A broadband light source 310 is used along with multiple FBG sensors 321-323. Each of the FBG sensors 321-323 are tuned to be primarily reflective to light at different wavelength bands and are deployed on the same optical fiber spaced apart from each other along the FO cable and at different distances from the light source 310. Each FBG sensor is designated to measure a different parameter or combination of parameters. The wavelength shifts caused by changes in the sensed parameters are small compared to the spacing between the characteristic base wavelengths of the individual FBGs. Therefore, it is feasible to separate the information from the different FBGs using linear variable filters or dispersive elements in an optical WDM scheme. Alternately, an optical TDM scheme can be implemented that operates by transmitting a train of short pulses of light in the FO cable, where the wavelengths of the light pulses differ from one another and selectively address the various FBG sensors along the FO cable.

FIG. 3 illustrates a monitoring system that monitors multiple parameters of an energy storage/power system with sensor outputs multiplexed using optical WDM. As indicated in FIG. 3, broadband light is transmitted by the light source 310, which may comprise or be a light emitting diode (LED) or superluminescent laser diode (SLD), for example. The spectral characteristic (intensity vs. wavelength) of the broadband light is shown by inset graph 391. The light is transmitted via the FO cable 311 to the first FBG sensor 321. The first FBG sensor 321 reflects a portion of the light in a first wavelength band having a central or peak wavelength, $\lambda_1$. Light having wavelengths other than the first wavelength band is transmitted through the first FBG sensor 321 to the second FBG sensor 322. The spectral characteristic of the light transmitted to the second FBG sensor 322 is shown in inset graph 392 and exhibits a notch at the first wavelength band centered at $\lambda_1$ indicating that light in this wavelength band is reflected by the first sensor 321.

The second FBG sensor 322 reflects a portion of the light in a second wavelength band having a central or peak wavelength, $\lambda_2$. Light that is not reflected by the second FBG sensor 322 is transmitted through the second FBG sensor 322 to the third FBG sensor 323. The spectral characteristic of the light transmitted to the third FBG sensor 323 is shown in inset graph 393 and includes notches centered at $\lambda_1$ and $\lambda_2$.

The third FBG sensor 323 reflects a portion of the light in a third wavelength band having a central or peak wavelength, $\lambda_3$. Light that is not reflected by the third FBG sensor 323 is transmitted through the third FBG sensor 323. The spectral characteristic of the light transmitted through the third FBG sensor 323 is shown in inset graph 394 and includes notches centered at $\lambda_1$, $\lambda_2$ and $\lambda_3$.

Light in wavelength bands 381, 382, 383, having central wavelengths $\lambda_1$, $\lambda_2$ and $\lambda_3$ (illustrated in inset graph 395) is reflected by the first, second, or third FBG sensors 321, 322, 323, respectively, along the FO cables 311 and 311' to the analyzer 330. The analyzer 330 may compare the shifts in each the central wavelengths $\lambda_1$, $\lambda_2$ and $\lambda_3$ and/or wavelength bands reflected by the sensors 321-323 to a characteristic base wavelength (a known wavelength) to determine whether changes in the parameters sensed by the sensors 321-323 have occurred. The analyzer may determine that the one or more of the sensed parameters have changed based on the wavelength analysis and may calculate a relative or absolute measurement of the change.

In some cases, instead of emitting broadband light, the light source may scan through a wavelength range, emitting light in narrow wavelength bands to which the various sensors disposed on the FO cable are sensitive. The reflected light is sensed during a number of sensing periods that are timed relative to the emission of the narrowband light. For example, consider the scenario where sensors 1, 2, and 3 are disposed on a FO cable. Sensor 1 is sensitive to a wavelength band (WB1), sensor 2 is sensitive to wavelength band WB2, and sensor 3 is sensitive to WB3. The light source may be controlled to emit light having WB1 during time period 1 and sense reflected light during time period 1*a* that overlaps time period 1. Following time period 1*a*, the light source may emit light having WB2 during time period 2 and sense reflected light during time period 2*a* that overlaps time period 2. Following time period 2*a*, the light source may emit light having WB3 during time period 3 and sense reflected light during time period 3a that overlaps time period 3. Using this version of TDM, each of the sensors may be interrogated during discrete time periods.

The FO cable used for energy storage/power system monitoring may comprise a single mode (SM) FO cable (as depicted in FIG. 3) or may comprise a multi-mode (MM) FO cable. While single mode fiber optic cables offer signals that are easier to interpret, to achieve broader applicability and lower costs of fabrication, multi-mode fibers may be used.

MM fibers may be made of plastic rather than silica, which is typically used for SM fibers. Plastic fibers may have smaller turn radii when compared with the turn radii of silica fibers, thereby making plastic fibers more practical to embed into battery cells and in individual cells of fuel cell stacks, for example. Furthermore, MM fibers can work with less expensive light sources (e.g., LEDs) as opposed to SM fibers that may need more precise alignment with superluminescent diodes (SLDs). Therefore, sensing systems based on optical sensors in MM fibers are expected to yield lower cost systems.

Figure 4:
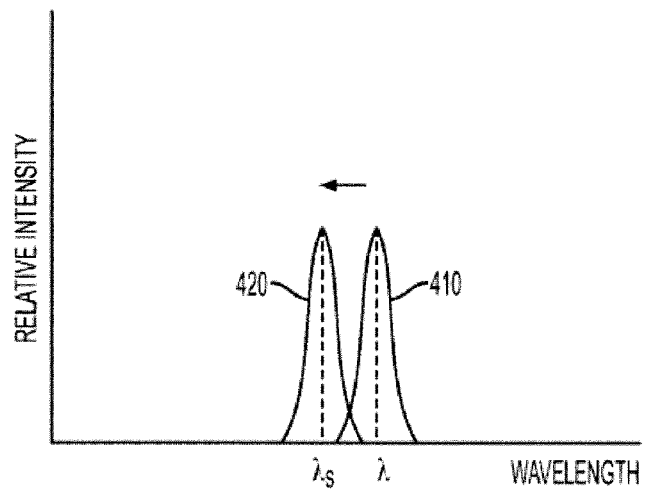
FIG. 4 depicts an idealized shift in the wavelength spectrum for a FBG sensor deployed on a single mode fiber cable.

FIG. 4 is an idealized representation of light reflected from a FBG sensor deployed on a SM FO cable. In the characteristic base or known state, the FBG sensor reflects light in a relatively narrow wavelength band 410 having a central or peak wavelength, $\lambda$. After the FBG sensor experiences a change in the sensed condition, e.g., a change in temperature, strain, chemical environment, the light reflected by the sensor shifts to a different wavelength band 420 having a central wavelength $\lambda_s$. Wavelength band 420 is similar in width, amplitude and other morphological characteristics when compared to wavelength band 410, but the central wavelength, $\lambda_s$, of wavelength band 420 is shifted 430 from the central wavelength, $\lambda$, of wavelength band 410 by an amount that is related to the change in the sensed condition. Wavelength bands of similar widths can be identified as wavelength bands having similar full width half maximum (FWHM) values, for example.

Figure 5:
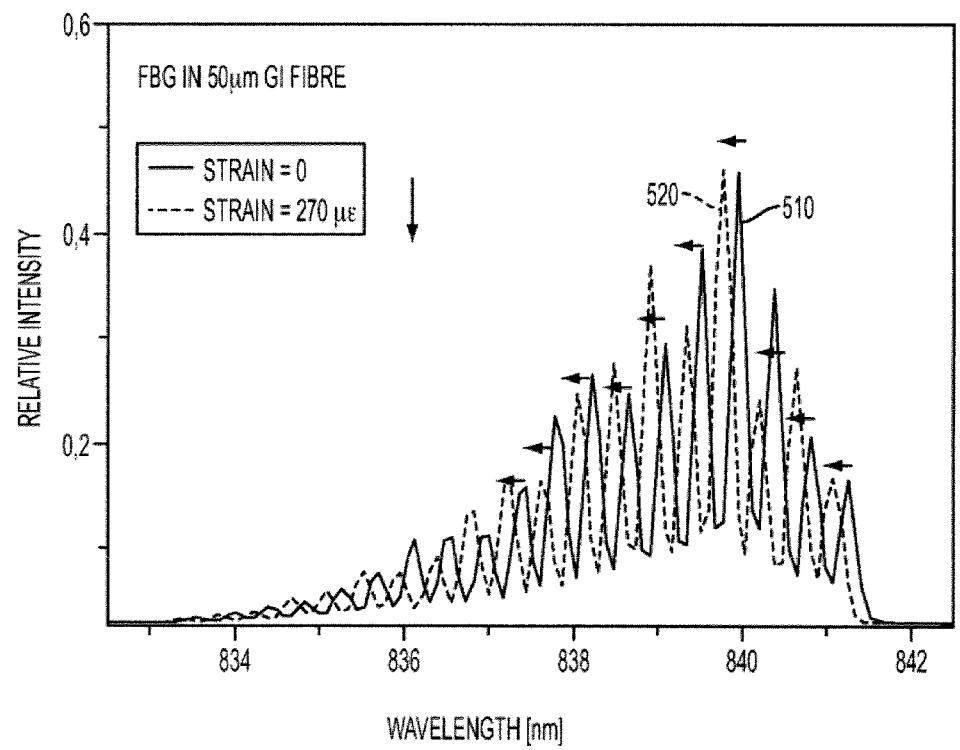
FIG. 5 depicts the shift in the wavelength spectrum for a FBG sensor deployed on a multi-mode fiber optic cable.

FIG. 5 depicts actual data from an FBG sensor deployed on a MM FO cable. FBG sensors deployed on MM FO cables reflect light in multiple wavelength bands in contrast to FBG sensors on SM FO cable where only one wavelength band is reflected by the grating. In the characteristic base condition, the sensor reflects a characteristic spectrum that may include multiple narrower wavelength bands (also referred to as modes) as shown in graph 510.

Figure 6:
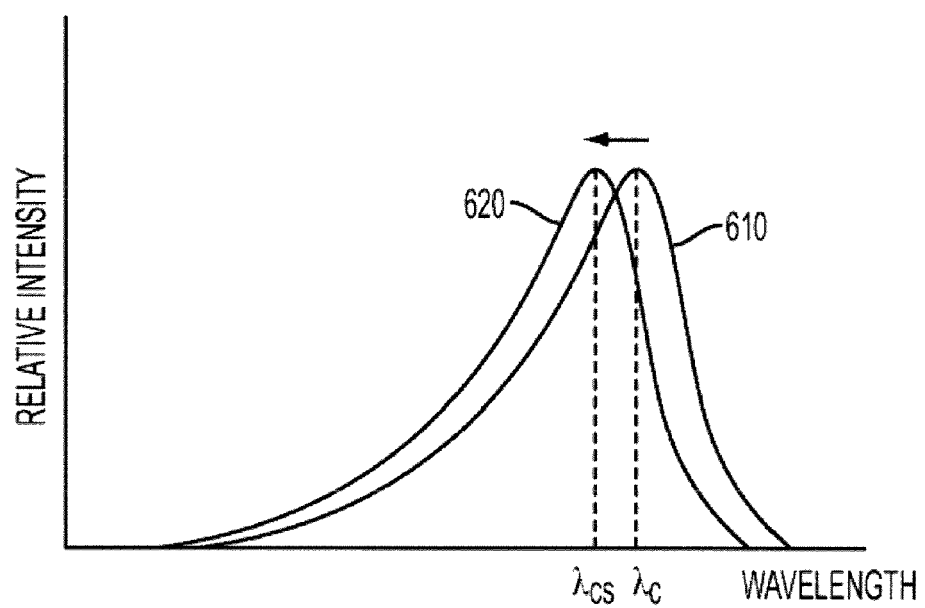
FIG. 6 depicts the shift in the wavelength spectrum modulated envelope of the FBG sensor of FIG. 5.

When a change in the sensed parameter occurs, the reflected wavelength spectrum 520 substantially maintains its shape, but is shifted in wavelength in response to the sensed condition. Analyzers discussed herein are particularly suited to interrogate MM FBG sensors because these analyzers detect the spectrum centroid (central value of the wavelength spectrum modulated envelope) rather than the shift of the individual modes. FIG. 6 shows the base wavelength spectrum modulated envelope 610 of the base wavelength spectrum 510 representing the reflected light when the FBG sensor is in the base condition. The envelope 610 may be characterized by a central or peak wavelength, $\lambda_c$, and a FWHM value. When exposed to the sensed condition, the reflected wavelength spectrum modulated envelope 620 of wavelength spectrum 520 shifts to a new central or peak wavelength, $\lambda_{cs}$. The envelope 620 may be characterized by a FWHM value and the central or peak wavelength, $\lambda_{cs}$. The FWHM value of the shifted 620 envelope may remain substantially unchanged from the base FWHM value, however the central or peak wavelength, $\lambda_{cs}$, is shifted from the base central wavelength, $\lambda_c$, by an amount related to the change in the sensed parameter.

Figure 7:
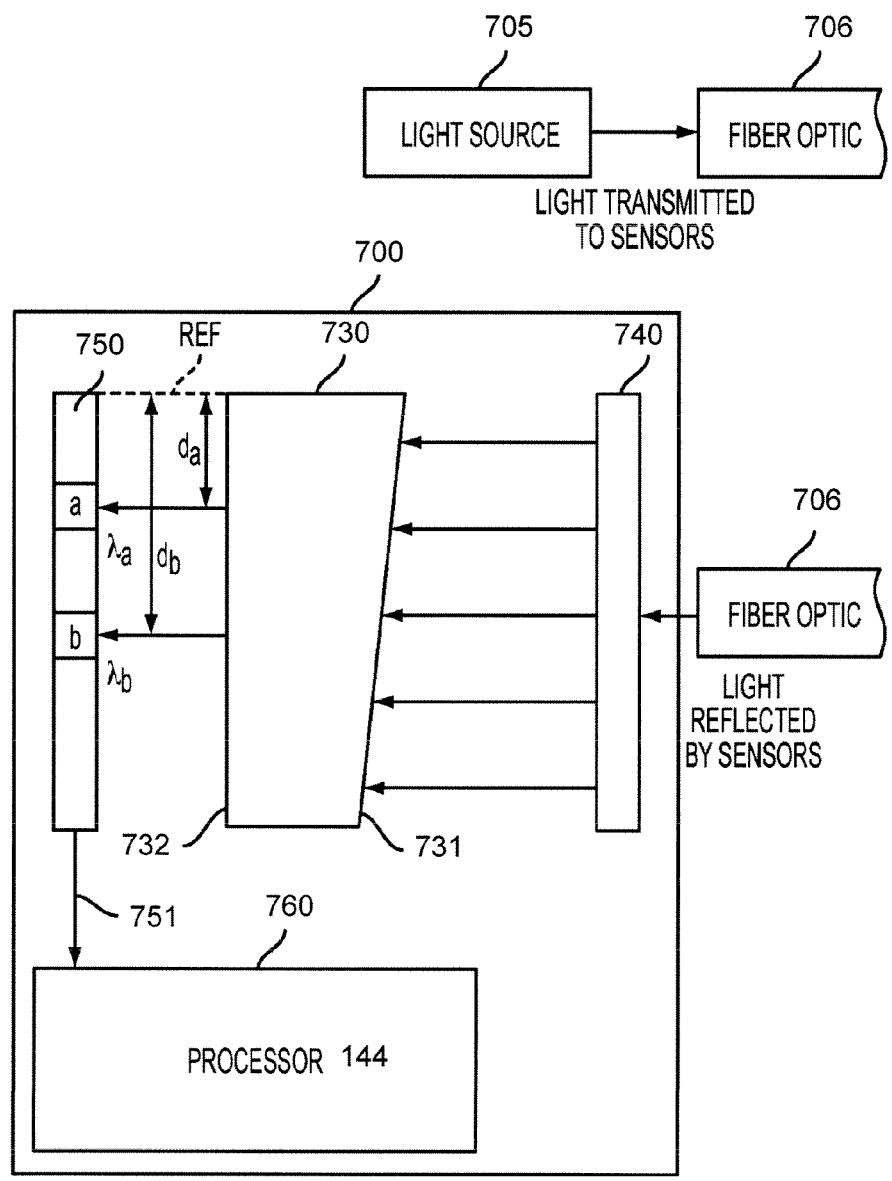
FIG. 7 is a block diagram depicting portions of an analyzer used to detect spectral changes in fiber sensor output signal.

FIG. 7 is a block diagram illustrating portions of a light source/analyzer 700 that may be used to detect and/or interpret optical signals received from an MM or SM FO cable having multiple optical sensors arranged at locations in, on or about an energy storage/power system (e.g., light source/analyzer 700 is utilized to implement light source/analyzer 141 in the embodiment of FIG. 1(A)). The light source 705 transmits input light to the sensors via FO 706. The analyzer 700 includes various components that may optionally be used to analyze the light reflected by the sensors and propagated by FO 706. The analyzer 700 includes an optional spreading component 740 configured to collimate and/or spread the light from the FO cable 706 across an input surface of a linearly varying transmission structure (LVTS) 730. In arrangements where sufficient spreading of the light occurs from the FO, the spreading component may not be used. The LVTS 730 may comprise a dispersive element, such as a prism, or linear variable filter. The LVTS 730 receives light at its input surface 731 (from the FO 710 and (optionally) the spreading component 740) and transmits light from its output surface 732. At the output surface 732 of the LVTS 730, the wavelength of the light varies with distance along the output surface 732. Thus, the LVTS 730 can serve to demultiplex the optical signal incident at the input surface 731 of the LVTS 730 according to the wavelength of the light. FIG. 7 shows two wavelength bands (called emission band) emitted from the LVTS 730, a first emission band has a central wavelength of $\lambda_a$ emitted at distance $d_a$ from a reference position (REF) along the output surface 732. The second emission band has a central wavelength $\lambda_b$ and is emitted at distance $d_b$ from the reference position. A position sensitive detector (PSD) 750 is positioned relative to the LVTS 730 so that light transmitted through the LVTS 730 falls on the PSD. For example, light having wavelength $\lambda_a$ falls on region a of the PSD 750 and light having wavelength $\lambda_b$ falls on region b of the PSD 750. The PSD generates an electrical signal along output 751 that includes information about the position (and thus the wavelength) of the light output from the LVTS. The output signal from the PSD is used by the processor 760 to detect shifts in the wavelengths reflected by the sensors.

The PSD may be or comprise a non-pixelated detector, such as a large area photodiode, or a pixelated detector, such as a photodiode array or charge coupled detector (CCD). Pixelated one-dimensional detectors include a line of photosensitive elements whereas a two-dimensional pixelated detector includes an n×k array of photosensitive elements. Where a pixelated detector is used, each photosensitive element, corresponding to a pixel, can generate an electrical output signal that indicates an amount of light incident on the element. The processor 760 may be configured to scan through the output signals to determine the location and location changes of the transmitted light spot. Knowing the properties of the LVTS allows determining peak wavelength(s) and shift of the peak wavelength(s) of the first and/or second emission band. The wavelength shift of the first or second emission band can be detected as a shift of the transmitted light spot at location a or b. This can, for example, be accomplished by determining the normalized differential current signal of certain pixels or pixel groups of the PSD.

For example, consider the example where light spot A having emission band $EB_A$ is incident on the PSD at location a. $I_{a1}$ is the current generated in the PSD by light spot A by pixel/pixel group at location a1 and $I_{a2}$ is the current generated in the PSD by light spot A by pixel/pixel group at location a2. Light spot B having emission band $EB_B$ is incident on the PSD at location b. $I_{b1}$ is the current generated in the PSD by light spot B by pixel/pixel group at location b1 and $I_{b2}$ is the current generated in the PSD by light spot B by pixel/pixel group at location b2.

The normalized differential current signal generated by pixels or pixel groups at locations a1 and a2 can be written $(I_{a1}-I_{a2})/(I_{a1}+I_{a2})$, which indicates the position of light spot A on the PSD. The wavelength of $EB_A$ can be determined from the position of light spot A on the PSD.

Similarly, the normalized differential current signal generated by pixels or pixel groups at locations b1 and b2 can be written $(I_{b1}-I_{b2})/(I_{b1}+I_{b2})$, which indicates the position of light spot B on the PSD. The wavelength of $EB_B$ can be determined from the position of light spot B on the PSD.

Figure 8:
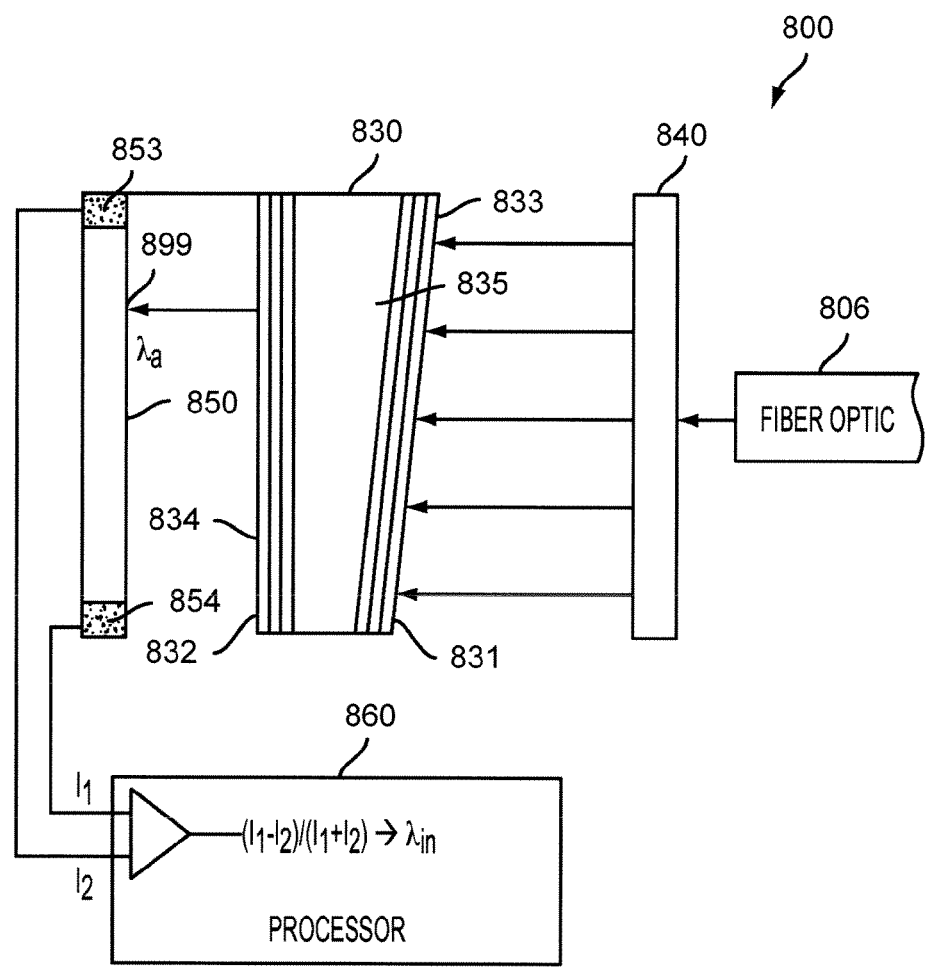
FIG. 8 is a block diagram depicting portions of an analyzer that uses a non-pixelated photosensitive detector.

FIG. 8 is a block diagram illustrating portions of an analyzer 800 that includes a non-pixelated, one-dimensional PSD 850 that may also be utilized in the embodiment of FIG. 1(A). The analyzer 800 includes an optional spreading component 840 that is similar to spreading component 740 as previously discussed. The spreading component 840 is configured to collimate and/or spread the light from the FO cable 806 across an input surface 831 of a linearly varying transmission structure (LVTS) 830. In the implementation depicted in FIG. 8, the LVTS 830 comprises a linear variable filter (LVF) that comprising layers deposited on the PSD 850 to form an integrated structure. The LVF 830 in the illustrated example comprises two mirrors, e.g., distributed Bragg reflectors (DBRs) 833, 834 that are spaced apart from one another to form optical cavity 835. The DBRs 833, 834 may be formed, for example, using alternating layers of high refractive index contrast dielectric materials, such as $SiO_2$ and $TiO_2$. One of the DBRs 833 is tilted with respect to the other DBR 834 forming an inhomogeneous optical cavity 835. It will be appreciated that the LVF may alternatively use a homogeneous optical cavity when the light is incident on the input surface at an angle.

The PSD 850 shown in FIG. 8 is representative of a non-pixelated, one-dimensional PSD although two-dimensional, non-pixelated PSDs (and one or two-dimensional pixelated PSDs) are also possible. The PSD 850 may comprise, for example, a large area photodiode comprising a semiconductor such as InGaAs. Two contacts 853, 854 are arranged to run along first and second edges of the semiconductor of the PSD to collect current generated by light incident on the surface of the PSD 850. When a light spot 899 is incident on the PSD 850, the contact nearest the light spot collects more current and the contact farther from the light spot collects a lesser amount of current. The current from the first contact 853 is denoted $I_1$ and the current from the second contact 854 is denoted $I_2$. The processor 860 is configured to determine the normalized differential current, $(I_1-I_2)/(I_1+I_2)$, the position of the transmitted light spot, and therefore the predominant wavelength of the light incident at the input surface 831 of the LVTS 830 can be determined. The predominant wavelength may be compared to known wavelengths to determine an amount of shift in the wavelength. The shift in the wavelength can be correlated to a change in the sensed parameter. In case two emission bands (creating two spatially separated light spots) hitting the detector at the same time the detector is only capable to provide an average wavelength and wavelength shifts for both emission bands. If wavelength and wavelengths shift of both emission bands need to be determined separately the two emission bands need to hit the detector at different time (time multiplexing).

In other embodiments, a two dimensional non-pixelated PSDs may be used, with edge contacts running along all four edges. The position of the central reflected wavelength may be determined by analyzing the current collected from each of the four contacts. The portion of the analyzer shown in FIG. 8 may be packaged together in a suitable housing, e.g., TO5 transistor header.

Figure 9A:
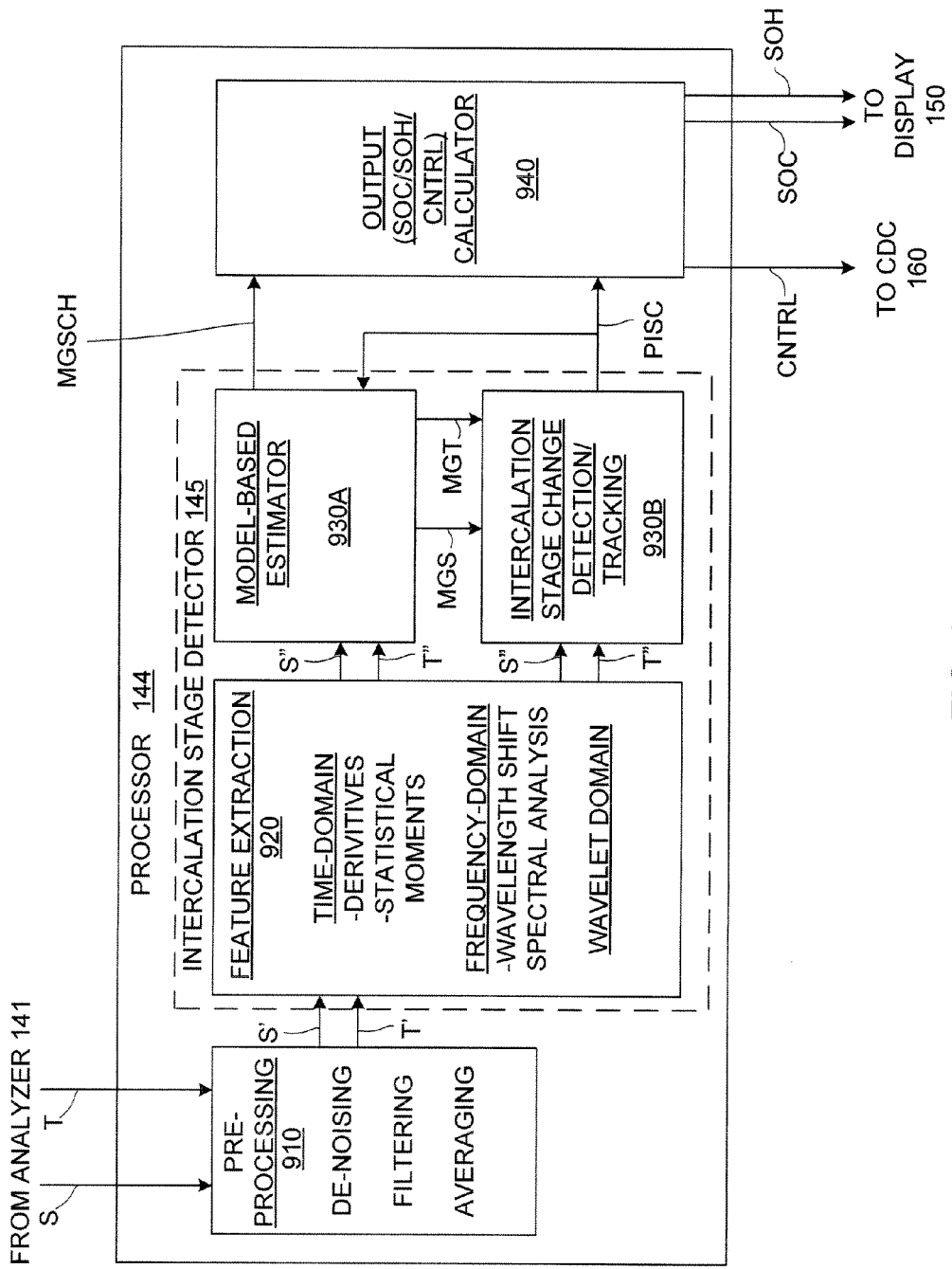
FIGS. 9(A) and 9(B) are block and flow diagrams, respectively, that illustrate a processor and process for generating operating state information and control information using detected intercalation stage changes according to an embodiment of the present invention.
Figure 9B:
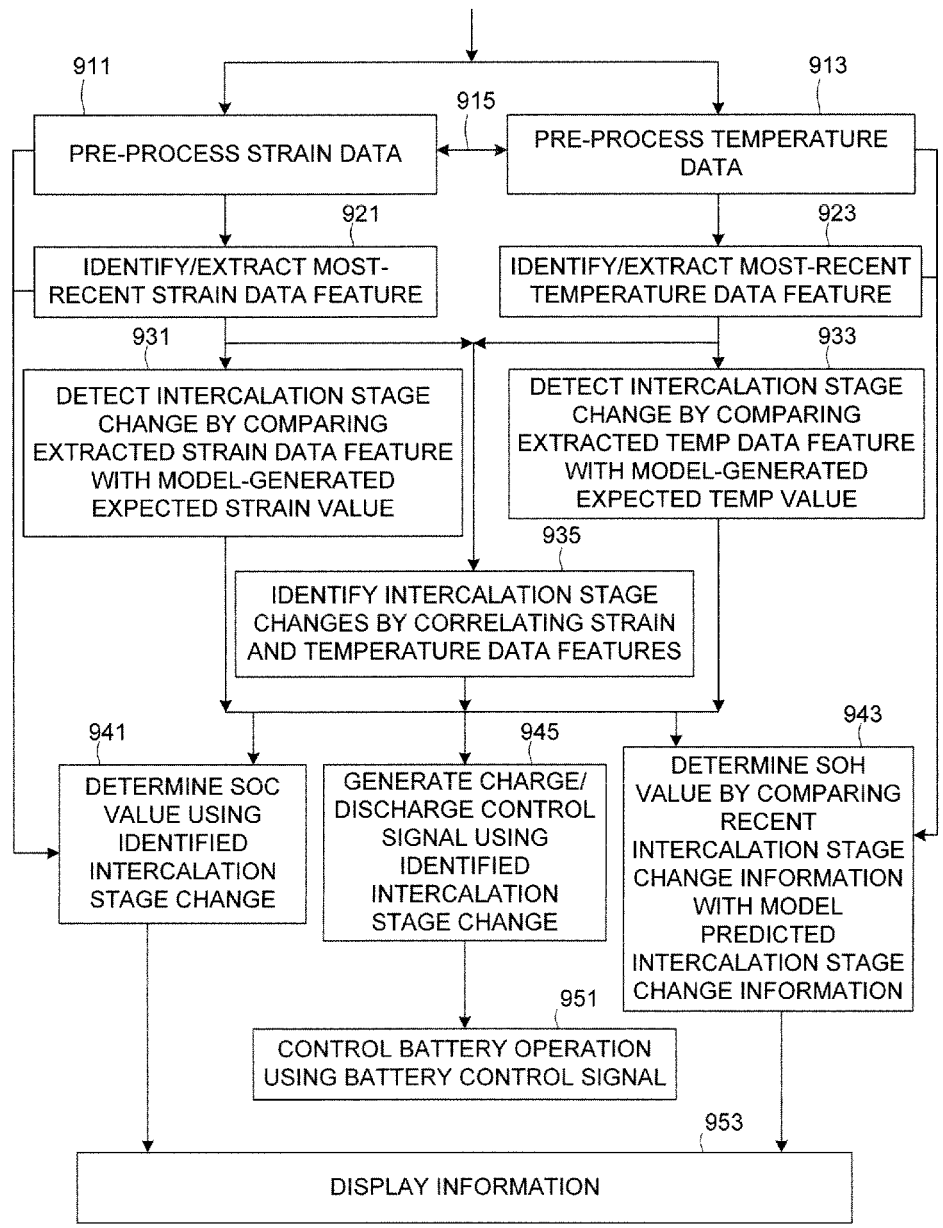

FIG. 9(A) is a block diagram showing processor 144 of FIG. 1(A) according to a specific embodiment using simplified functional format, and FIG. 9(B) is a flow diagram indicating generalized operations performed by processor 144 according to alternative embodiments. As indicated in FIG. 9(A), processor 144 generally includes a pre-processing section 910, intercalation stage detector 145, and an output calculator section 940.

Referring to the left side of FIG. 9(A), pre-processing section 910 receives "raw" strain data S and temperature data T from light source/analyzer 141, performs one or more known pre-processing operations (e.g., de-noising, filtering, and averaging), and generates pre-processed strain data S' and temperature data T' that is passed to intercalation stage detector 145. As indicated in blocks 911 and 913 in FIG. 9(B), in one embodiment strain data S is processed separately from temperature data T. As indicated by double-arrow line 915, in another embodiment both strain and temperature data are processed simultaneously such that pre-processed strain data S is deconvoluted using temperature data T, and/or pre-processed temperature data T' is deconvoluted using strain data S.

Referring to the center of FIG. 9(A), in accordance with an embodiment of the invention, intercalation stage detector 145 includes a feature extraction section 920 for identifying and extracting at least one data feature from pre-processed strain data S' and pre-processed temperature data T', a model-based estimator section 930A, and an intercalation stage change detection/tracking section 930B that function to detect at least one intercalation stage change of EED 110 in accordance with the measured operating parameter data obtained from the optical sensors.

In a specific embodiment, feature extraction section 920 applies one or more known data analysis techniques (e.g., time-domain analysis, frequency-domain analysis, and/or wavelet domain analysis) to pre-processed strain data S' and temperature data T' in order to identify strain data features S" and temperature data features T". As indicated by blocks 921 and 923 in FIG. 9(B), in a specific embodiment this process involves separately extracting most-recent strain data features and most-recent temperature data features.

Referring to FIG. 9(A), according to an embodiment of the present invention, model-based estimator section 930A performs a model-based estimation process 930A that generates estimated "model-based" parameter values (e.g., model-generated strain value MGS and model-generated temperature value MGT) based on previously measured strain/temperature values, and intercalation stage detection/tracking section 930B performs a detection/tracking process that compares the estimated strain/temperature values MGS and MGT with present (most-recent) strain/temperature features S" and T" to detect a present intercalation stage change PISC. Referring to FIG. 9(B), in accordance with alternative embodiments, one or both of strain/temperature features S" and T" are utilized in the detection of present intercalation stage change PISC. For example, in block 931, an extracted strain data feature S" is compared with a model-generated strain value MGS associated with previous intercalation stage changes to detect present intercalation stage change PISC. Alternatively, as indicated in block 933, an extracted temperature data feature T" is compared with a model-generated temperature value MGT associated with previous intercalation stage changes to detect said present intercalation stage change PISC. Finally, as indicated in block 935, a strain data feature S" is correlated with a current temperature data feature T" to identify present intercalation stage change PISC.

Referring again to model-based estimator 930A (FIG. 9(A)), the model-based estimation process also calculates a difference between the estimated and present strain/temperature values, and generates/updates an intercalation stage transition point history MGSCH, which is supplied to output calculator section 940. Output calculator section 940 functions to generate at least one of (a) operating state information SOX (e.g., state-of-charge (SOC), state-of-health (SOH), or state-of-power (SOP) information and (b) charge/discharge control information CNTRL in accordance with at least one of present intercalation stage change PISC and intercalation stage transition point history MGSCH.

Referring to block 941 in FIG. 9(B), in one specific embodiment a most-recent SOC value is generated using most-recent intercalation stage change PISC, e.g., by comparing most-recent intercalation stage change PISC with intercalation stage transition point history MGSCH. As discussed in additional detail herein, intercalation stage changes occur at predictable battery charge levels, so determining a most-recent SOC value is achieved by recording a history of intercalation stage changes during multiple charge/discharge cycles, and keeping track of the most recently occurring stage changes. By continuously monitoring intercalation stage changes occurring inside a battery (or other EED), updating the most-recent SOC value, and generating a suitable visual display (e.g., using display device 150 shown in FIG. 1(A); see block 953), the present invention provides SOC information that is far more accurate and reliable than that provided by conventional methodologies relying on voltage and battery current.

Referring to block 943 in FIG. 9(B), in another specific embodiment a most-recent SOH value is generated by comparing most-recent intercalation stage change CISC with model-predicted intercalation stage change information (e.g., supplied in intercalation stage transition point history MGSCH). As discussed in additional detail herein, intercalation stage changes occur on a predictable operating schedule, so identifying anomalies in the pattern of intercalation stage changes (e.g., unusual onset delays or durations) that cannot be accounted for by environmental considerations (e.g., high ambient temperatures) provides a reliable methodology for determining SOH of a battery or other EED. By continuously monitoring intercalation stage changes occurring inside a battery (or other EED), updating the most-recent SOH value in accordance with the analysis discussed herein, and generating a suitable visual display (e.g., using display device 150 shown in FIG. 1(A)), the present invention provides SOH information that is far more accurate and reliable than that provided by conventional methodologies relying on voltage and current.

Referring to block 945 in FIG. 9(B), in another specific embodiment a charge/discharge control signal CNTRL is generated in accordance with present intercalation stage change PISC, and then (block 951) one of a charging operation and a discharging operation of EED is controlled in accordance with control signal CNTRL.

In one embodiment, the model-based estimation process performed by intercalation state detector 145 effectively models the subject EED (e.g., a Lithium-ion battery) as a dynamical system that is influenced by the load current (the input), and responds with estimated strain and temperature values (the output). The model is initiated with an initial strain and temperature at time t=0, and compares for subsequent time instants the "present" (most-recently) measured strain and temperature data with the previous strain and temperature values, and then feeds the difference back in order to estimate internal battery states such as SOC that are not observed at the output, and to provide filtered updated estimates of the strain and temperature. In alternative embodiments, load current measurements are either used or not used in the model calculations. In another embodiment, the model-based estimation process is based on a single model or a collection of models corresponding to each of the intercalation stages.

The processor details and methodology described above with reference to FIGS. 9(A) and 9(B) will now be described in additional detail with reference to FIGS. 10 through 16, which include various timing diagrams that are used to explain the purpose and benefit of performing feature extraction and intercalation stage change detection.

Figure 10:
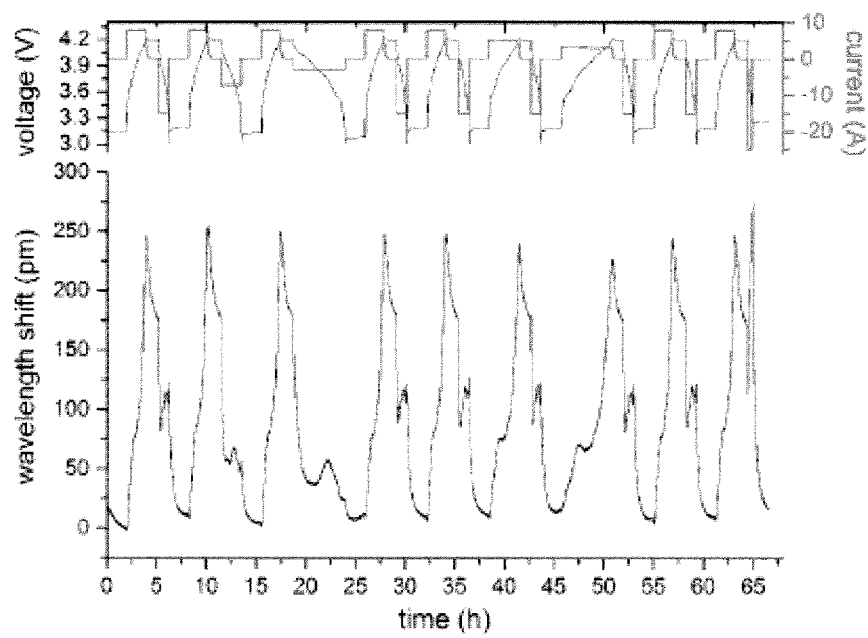
FIG. 10 is a two-part diagram depicting FO output signals including strain-induced and temperature-induced contributions (information)

FIG. 10 is a timing diagram showing output signal (wavelength shift data) generated by an exemplary FO sensor that was mounted on an Li-ion battery in the manner described above with reference to optical sensor 130-1 of FIG. 1(A). The upper portion of the diagram shows current (indicated by the more square-waveform line) and output voltage versus time. The diagram indicates signals taken while the Li-ion battery cell was cycled at different Charge-rates (C-rates), and the data indicates temperature and strain induced wavelength changes during cycling. For data shown in FIG. 10, the battery was discharged with various C-rates (C, C/2, C/5, 2C (very last cycle)) while charged with a constant C-rate (C/2). This cycling is performed to ensure that each discharge starts from the same SOC value. Afterwards the battery was charged with various C-rates (C/2, C/3, C/5) while discharged with a constant C-rate. The measured wavelength shift is a convolution of strain-induced and temperature-induced wavelength shifts.

Figure 11:
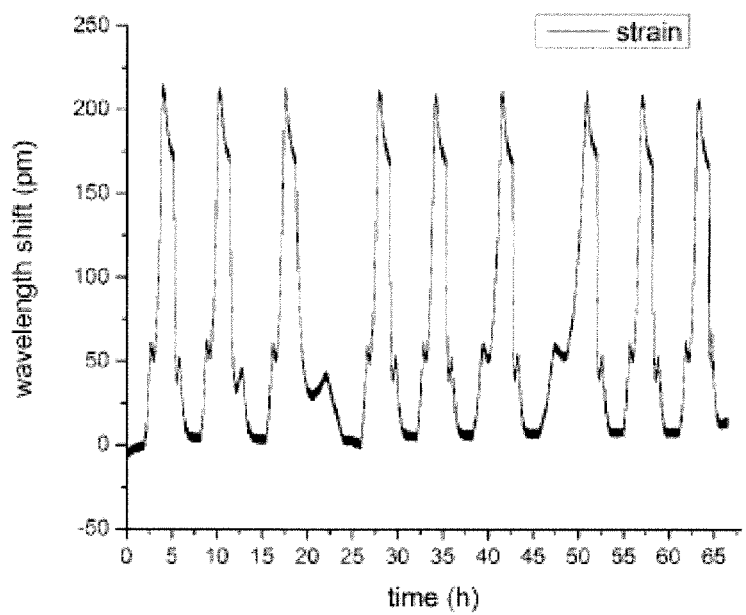
FIG. 11 is a diagram depicting strain-induced wavelength changes for different charge/discharge cycles.
Figure 12:
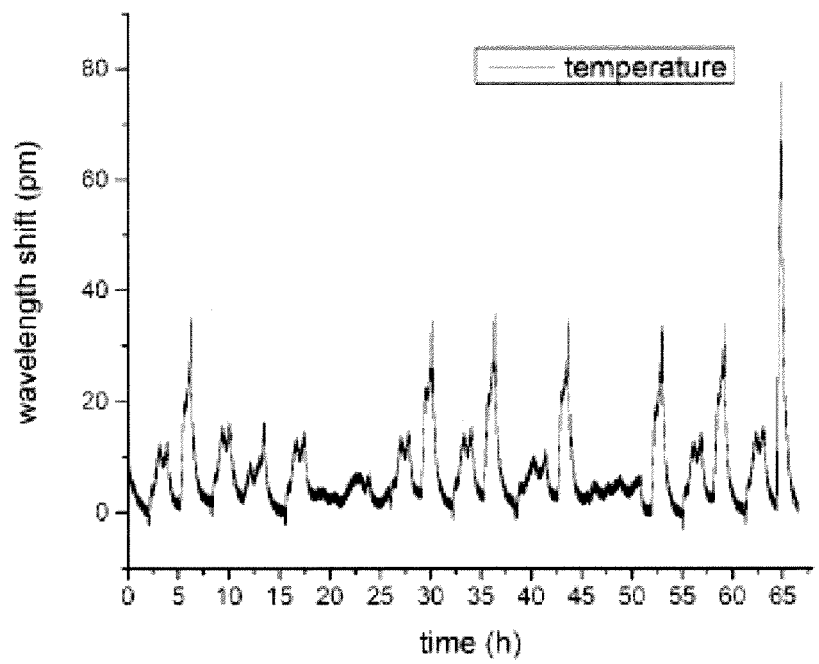
FIG. 12 is a diagram depicting temperature-induced wavelength changes for different charge/discharge cycles.

According to one embodiment of the present invention, the strain and temperature data is analyzed as-is to extract data features that are characteristic to a most-recent intercalation stage change. In many cases however it may be favorable to de-convolute the temperature- and strain-induced changes before data analysis, which is accomplished using various known methods as discussed above. FIG. 11 shows de-convoluted strain, and FIG. 12 shows the de-convoluted temperature data of measurement shown in FIG. 10. By analyzing these corrected data it is possible to extract informative data features.

In a preferred embodiment, strain data S is de-convoluted using temperature data T (i.e., the processed strain information is modified to remove temperature related effects in order to extract "pure" strain information that allows estimate of accurate SOC values). The present inventors found through experimentation that different intercalation stages in Li-ion batteries are characterized by strain-derived wavelength shift time-series features that remain stable with respect to charge/discharge rates. Using Coulomb counting on standard charge and discharge cycles, the present inventors found that time-series features like gradients and points of inflection, as well as shape features like peaks and radii of curvature, can be recognized using known processing techniques, and correlated to intercalation stages that correspond with associated SOC values. The extracted features from strain data S correlate nicely with features in the open circuit voltage which are typically used to visualize different Li-intercalation stages. These features are typically only visible using voltage data at very low C-rates (e.g., C/25). In contrast, the features in the extracted strain data generated by way of FO sensor are observable at higher C-rates and are visible for different C-rates at the same SOC values. Once this correlation function has been identified using machine-learning algorithms, the correlation function is used for estimating the SOC at real-time during charge or discharge based on the extracted strain information (i.e., the measured strain data S values determined by wavelength shift, corrected for temperature effects using temperature data T).

Figure 13:
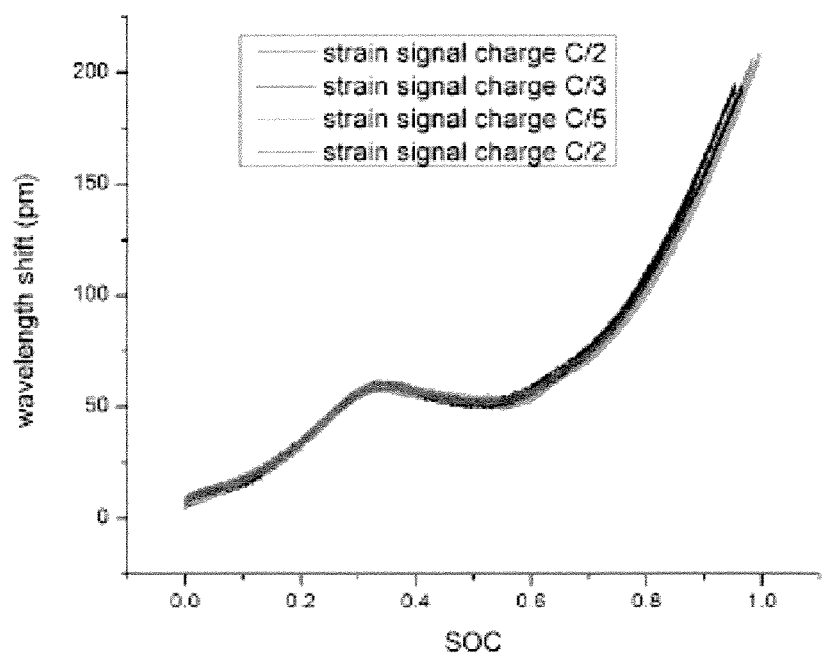
FIG. 13 is a diagram depicting strain signal versus SOC obtained for different various charge cycles at different Charge-rates.
Figure 14:
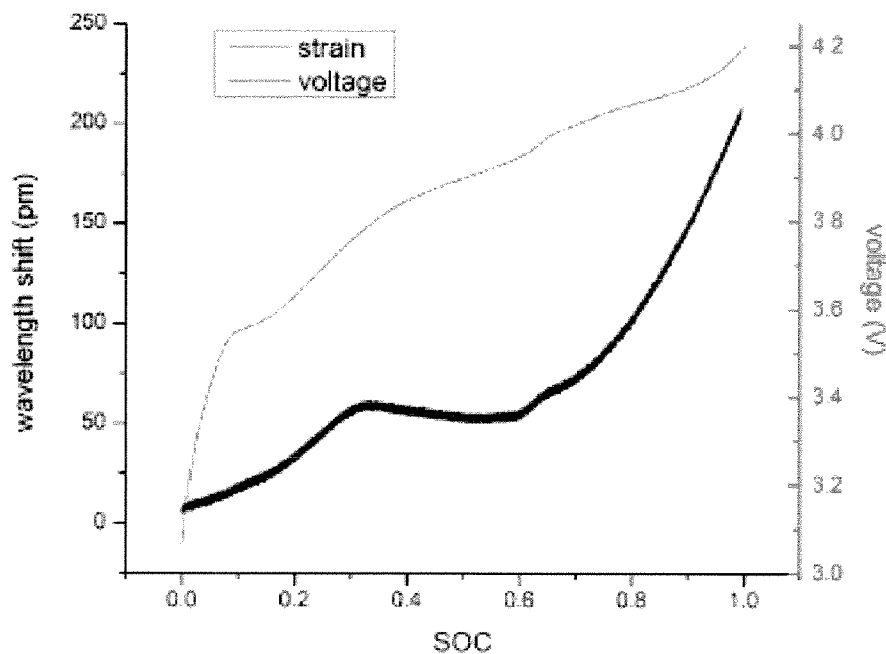
FIG. 14 is a diagram comparing strain-induced wavelength shift and voltage data versus SOC obtained for a C/25 charge cycle.

One approach to analyze and understand the corrected strain and temperature signals is to plot the data of each individual charge or/and discharge cycles versus state-of-charge (SOC), and to store the data in a memory for reference during intercalation stage change identification (analysis). The SOC values can be determined by using Coulomb-counting during charge/discharge cycles. FIG. 13 shows extracted strain data versus SOC for several charge cycles obtained at different charge rates (C-rates). All curves obtained with different C-rates are almost lying on top of each other, which mean that the measured strain and the value of SOC are being strongly correlated to each other. All strain curves are showing characteristic features which are located at exactly the same SOC values. Assigning these characteristic features to corresponding Li-ion intercalation stages in the battery is achieved by comparing these curves to data of the voltage (or open circuit voltage) measured at low C-rates. Such measurements are typically used to visualize different Li-ion intercalation stages. FIG. 14 shows both the strain-induced wavelength shift vs. SOC and the voltage vs. SOC for a C/25 charge cycle in comparison. Please note that the features in voltage data are typically only visible at very low C-rates (e.g., C/25). In contrast the characteristic features in the strain data can still be observed at larger C rates. In addition, the characteristic features are observable at exactly the same SOC values independent with what C-rate they have been measured.

Figure 15:
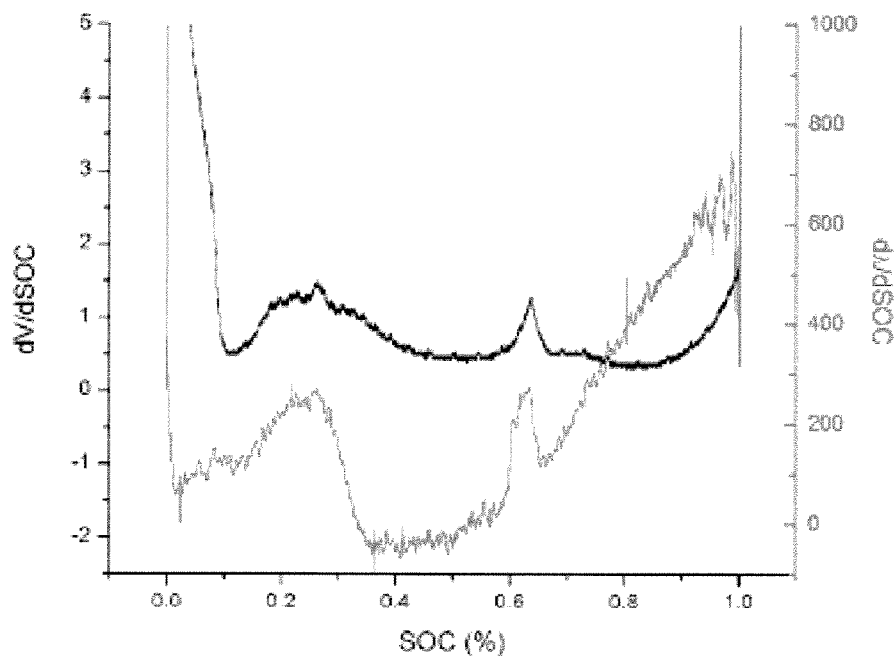
FIG. 15 is a diagram depicting a derivative of strain-induced wavelength shift data for a C/5 charge cycle in comparison with the derivative of voltage data measured for a C/25 charge cycle.

Referring briefly to FIG. 9(A), feature extraction section 920 utilizes one or more known data analysis techniques in order to identify the strain and temperature data features for purposes of identifying corresponding intercalation stages. These techniques include time-domain analysis (e.g., analyzing derivatives or statistical moments), frequency-domain analysis (e.g., wavelength shift spectral analysis), or wavelet domain analysis. In a presently preferred embodiment, derivatives of the strain and temperature data are calculated and analyzed in order to identify the characteristic features associated with corresponding intercalation stages, which in turn may be used to calculate a battery's present (i.e., most-recent) SOC. For illustrative purposes, FIG. 15 shows a comparison of the derivative of the strain data at C/5 and voltage data at C/25.

Figure 16:
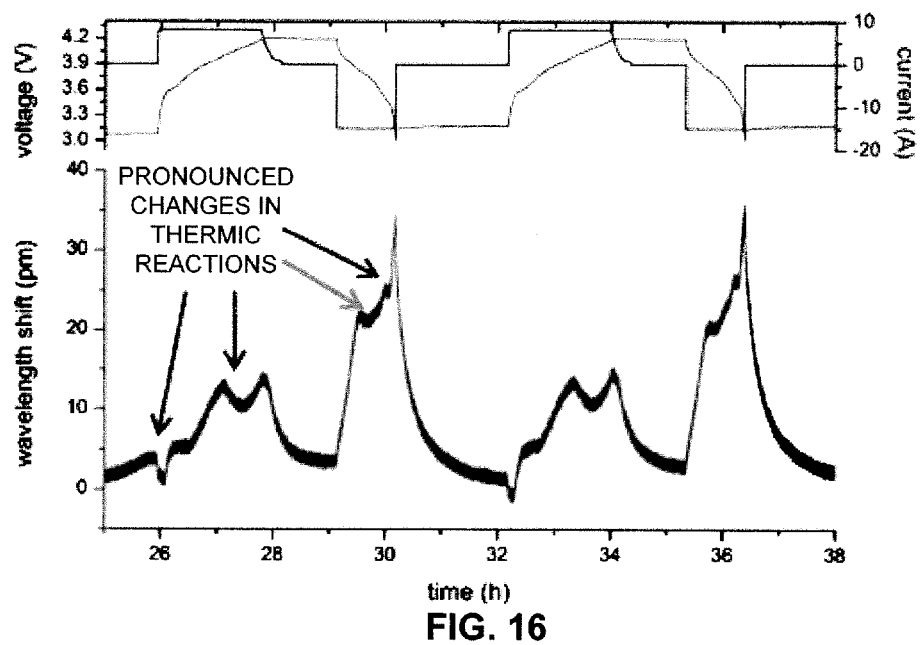
FIG. 16 is a diagram depicting temperature changes in an Li-ion battery versus time.
Figure 17:
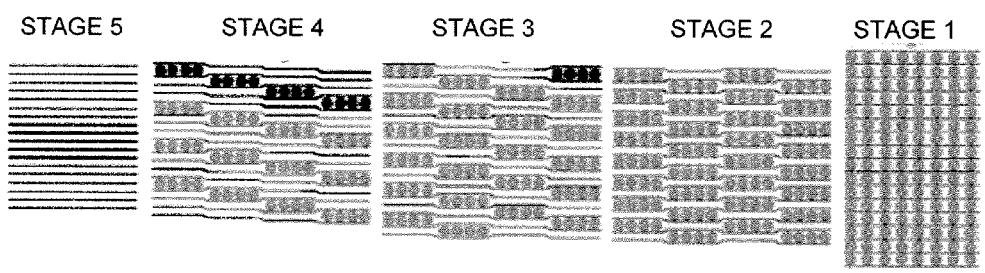
FIG. 17 is a simplified diagram depicting various intercalation stages in a Li-ion battery.

In addition to detecting intercalation stage changes using strain data S, intercalation stage changes of certain EEDs (e.g., Li-ion batteries) are also detectable by way of detecting certain temperature changes (e.g., heat generation) that are indicated by temperature data T. These temperature data features are, for instance, related to endothermic and exothermic reactions which take place during charge and discharge of a Li-ion battery. FIG. 16 shows two cycles with a C/2 charge and 1C discharge. Within both the charge and discharge phase one can clearly observe certain endothermic, exothermic reactions and changes of exothermic reactions. In FIG. 16, the most pronounced endothermic or changes of exothermic reaction during the first charge and discharge cycle are marked with arrows. Note that the wavelength shift on the y-axis is directly correlated to the internal temperature (i.e., 1 pm wavelength shift correlates to a temperature change of about 0.1° C.). These characteristic features in temperature data clearly show that, at specific SOC values, endothermic and different exothermic reaction take place that are believed to be associated with corresponding intercalation stage changes. Closely monitoring the internal temperature of EED 110 does therefore also facilitate identifying different Li-ion intercalation stages during charge and discharge of EED 110. In a specific embodiment, the temperature data features indicating intercalation stage changes are correlating with the strain data features, obtained as discussed above, thereby providing another method for identifying intercalation stage change events.

In addition to utilizing strain and thermal data features to determine most-recent SOC values, any changes of the onset or duration of intercalation stages with respect to SOC during either charge or discharge can be used to signify degradation of the battery chemistry. Using long-term cycling experiments, these intercalation stage onset and duration features, expressed in terms of SOC, can be used to determine the SOH of the battery. Typically the reversible changes are useful for SOC estimation while the irreversible changes are useful for SOH estimation.

In addition to using strain and thermal data obtained in the manner described above to determine SOH values, other structural changes may be monitored and utilized in the SOH determination as well. For example, the structural integrity of a battery cell in general, the structural integrity of electrode material, quality of electrolyte (e.g. gas formation due to electrolyte decomposition), sealing of cell package itself and so forth can be monitored by measuring strain and temperature inside and/or outside of the battery cell. The idea is to identify characteristic features in the strain and temperature data which are correlated to the reversible and irreversible structural changes discussed above.

The specifications for the monitoring and management systems detailed above allow real-time (at 100 Hz) detection of intercalation stage changes by way of temperature and strain parameters. Thus, it is feasible to approach 100% diagnostic sensitivity. The immunity to EMI and ability to function in harsh environments without degraded performance implies that false alarms from such systems will be minimal, thereby making it realistic to achieve >95% diagnostic specificity.

Due to uncertainties in estimates of internal cell-state variables, most commercial Li-ion battery systems today are conservatively designed and thus only allow access to 10-80% of their stored energy capacity. Embodiments disclosed herein enable accurate real-time (at 100 Hz) detection of intercalation stage changes by way of measured temperature and strain parameters that enable high-accuracy (2.5%) predictions of remaining battery charge, allowing reductions in conservative over-design. In addition, using algorithms that are based on accurate intercalation stage measurements, it is feasible to get more accurate state-of-health estimates and extend cell life, resulting in even greater reductions in over-sizing design practices.

The foregoing description of various embodiments has been presented for the purposes of illustration and description and not limitation. The embodiments disclosed are not intended to be exhaustive or to limit the possible implementations to the embodiments disclosed. Many modifications and variations are possible in light of the above teaching.

The invention claimed is:

1. A system, comprising:
an electrochemical energy device comprising an electrode material and a guest species contained inside a cell wall;
one or more optical fibers having a first portion disposed on the electrochemical energy device;
a light source configured to provide light onto the one or more optical fibers;
at least one optical sensor disposed on the one or more optical fibers adjacent to the first portion, the optical sensor configured to modulate the light in accordance with a measured operating parameter associated with an operating condition of said electrochemical energy device such that at least one light signal generated by said at least one optical sensor includes operating parameter data associated with said measured operating parameter;

an analyzer coupled to a second end of said one or more optical fibers, the analyzer configured to receive said at least one light signal from said one or more optical fibers, and convert said at least one light signal into corresponding operating parameter data signals; and a processor configured to detect a present intercalation stage change of the electrochemical energy device by analyzing said operating parameter data signals, said present intercalation stage change being caused by migration of the guest species within the electrode material.

2. The system of claim 1, wherein said at least one optical sensor comprises at least one of a first optical sensor configured to measure a strain parameter of said electrochemical energy device and to generate a first light signal, and a second optical sensor configured to measure a temperature parameter of the electrochemical energy device and to generate a second light signal, and wherein said detector is configured to convert said first light signal into strain parameter data signals associated with said measured strain parameter, and convert said second light signal into temperature parameter data signals associated with said measured temperature parameter.

3. The system of claim 2, wherein said at least one optical sensor comprises both said first optical sensor configured to measure said strain parameter, and said second optical sensor configured to measure said temperature parameter.

4. The system of claim 3, wherein said one or more optical fibers comprises a single optical fiber, and wherein said first and second optical sensors are disposed on said single optical fiber such that both said first and second light signals are transmitted on said single optical fiber.

5. The system of claim 1, wherein said at least one optical sensor comprises at least one of:

an externally disposed sensor mounted on an external surface of said cell wall, and an internally disposed sensor mounted inside said cell wall.

6. The system of claim 5, wherein said at least one optical sensor comprises:

a first optical sensor disposed on said one or more optical fibers that is operably attached to an external surface of the cell wall such that the first optical sensor is configured to measure mechanical strain of the cell wall, and a second optical sensor disposed on said one or more optical fibers that is operably attached to the external surface of the cell wall such that the second optical sensor is configured to sense an external temperature of the cell wall.

7. The system of claim 5, wherein said one or more optical fibers include an optical fiber extending through the cell wall such that the first portion of the optical fiber is disposed inside said cell wall, and wherein said at least one optical sensor comprises:

a first optical sensor disposed on said optical fiber and operably attached to at least one of an internal surface the cell wall and said electrode material of the electrochemical energy device such that the first optical sensor is configured to measure mechanical strain from inside said cell wall, and a second optical sensor disposed on the optical fiber and operably attached to said at least one of the internal surface the cell wall and said electrode material such that the second optical sensor is configured to measure an internal temperature from inside said cell wall.

8. The system of claim 1, wherein said at least one optical sensor comprises one of a fiber Bragg grating sensor, an etalon sensor, and a Fabry-Perot sensor.

9. The system of claim 1, wherein said analyzer comprises a linear variable filter configured to resolve sub-picometer wavelength shifts in said at least one light signal.

10. The system of claim 1, wherein said processor is configured to extract at least one data feature from said operating parameter data signals using one of time-domain analysis, frequency-domain analysis and wavelet domain analysis, and to analyze said extracted data feature to detect said a present intercalation stage change.

11. The system of claim 10, wherein said processor is configured to compare an extracted strain data feature with a model-generated strain value associated with previous intercalation stage changes to detect said present intercalation stage change.

12. The system of claim 10, wherein said processor is configured to compare an extracted temperature data feature with a model-generated temperature value associated with previous intercalation stage changes to detect said present intercalation stage change.

13. The system of claim 10, wherein said processor is configured to correlate a current strain data feature with a current temperature data feature to identify said present intercalation stage change.

14. The system of claim 10, wherein said processor is further configured to determine at least one of a state-of-charge value and a state-of-health value in accordance with said detected present intercalation stage change, and visually display said at least one of said state-of-charge and said state-of-health value.

15. The system of claim 10, wherein said processor is further configured to generate a charge/discharge control signal in accordance with said detected present intercalation stage change, and control one of a charging operation and a discharging operation of said electrochemical energy device in accordance with said charge/discharge control signal.

16. The system of claim 1, wherein the electrochemical energy device comprises one of a rechargeable battery, a supercapacitor and a fuel cell disposed on one of a hybrid/electric vehicle and a smart grid system, and wherein the system further comprises a display for visually displaying at least one of a state-of-charge value and a state-of-health value to an operator of said one of said hybrid/electric vehicle and said smart grid system.

17. The system of claim 16, wherein said electrochemical energy device comprises a Lithium-ion battery, wherein at least one optical sensor is configured to measure one of a strain parameter and a temperature parameter of said Lithium-ion battery, and wherein said processor is configured to generate charge/discharge control information for controlling at least one of a charging rate and a discharge rate of said Lithium-ion battery.

18. A system comprising:

a Lithium-ion battery comprising an electrode material and Lithium-ions as guest species;

an optical fiber having a first portion connected to the electrochemical energy device;

first and second optical sensors disposed on the optical fiber, the first optical sensor configured to sense a strain parameter of the electrochemical energy device, and the second optical sensor configured to sense a temperature parameter of the electrochemical energy device; and a control circuit including:

a light source/analyzer configured to provide light to the optical fiber, detect first and second light signals from the first and second optical sensors, generate strain data signals based on the first light signals received from the first optical sensor, and generate temperature data signals based on the second light signals received from the second optical sensor, a processor configured to analyze said strain data signals and said temperature data signals to detect at least one intercalation stage change of the Lithium-ion battery, said detected at least one intercalation stage change being caused by migration of the guest species within the electrode material such that said migration causes a characteristic change in said measured strain and temperature parameters, and the processor further configured to generate at least one of operating state information and control information in accordance with said detected at least one intercalation stage change.

19. The system of claim 18, wherein said processor is further configured to:

extract a strain data feature and a temperature data feature from said strain and said temperature parameter data using one of time-domain analysis, frequency-domain analysis and wavelet domain analysis; and analyze said extracted data feature to detect said present intercalation stage change by comparing one of said extracted strain data feature and said extracted temperature data feature with a model-generated value associated with previous intercalation stage changes to detect said present intercalation stage change.

20. A method for managing an electrochemical energy device, said electrochemical energy device including an electrode material and a guest species, the method comprising:

utilizing one or more optical sensors to measure one of a strain parameter and a temperature parameter of the electrochemical energy device during a charge/discharge operating period;

transmitting at least one light signal from said one or more optical sensors to an analyzer, said at least one light signal including at least one of strain data and temperature data associated with said measured one of said strain parameter and said temperature parameter, detecting a present intercalation stage change of the electrochemical energy device by analyzing said at least one of said strain data and said temperature data, said present intercalation stage change being caused by migration of the guest species within the electrode material, generating control information in accordance with said detected present intercalation stage change, and utilizing said control information to control at least one of a charging rate and a discharging rate of said electrochemical energy device during said charge/discharge operating period.

* * * * *